United States Patent
Kusumoto et al.

(10) Patent No.: US 8,592,936 B2
(45) Date of Patent: Nov. 26, 2013

(54) PHOTOELECTRIC CONVERSION DEVICE AND ELECTRONIC DEVICE, AND METHOD FOR MANUFACTURING PHOTOELECTRIC CONVERSION DEVICE

(75) Inventors: Naoto Kusumoto, Isehara (JP); Kazuo Nishi, Tochigi (JP); Yuusuke Sugawara, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/528,878

(22) Filed: Jun. 21, 2012

(65) Prior Publication Data

US 2012/0256286 A1 Oct. 11, 2012

Related U.S. Application Data

(63) Continuation of application No. 12/068,849, filed on Feb. 12, 2008, now Pat. No. 8,207,589.

(30) Foreign Application Priority Data

Feb. 15, 2007 (JP) ................. 2007-034650

(51) Int. Cl.
*H01L 31/00* (2006.01)

(52) U.S. Cl.
USPC ........... 257/459; 257/433; 257/458; 257/698; 257/E31.117; 257/E31.124; 257/E31.126; 438/64; 438/98

(58) Field of Classification Search
USPC ................... 257/433, 458, 459, 698, 257/E21.124–E31.126, 81, 100, E33.065, 257/E33.066, E33.062; 438/64, 98, 26
See application file for complete search history.

(56) References Cited

U.S. PATENT DOCUMENTS

| | | |
|---|---|---|
| 4,690,714 A | 9/1987 | Li |
| 5,291,038 A | 3/1994 | Hanamoto et al. |

(Continued)

FOREIGN PATENT DOCUMENTS

| | | |
|---|---|---|
| EP | 0 790 653 | 8/1997 |
| EP | 1583148 A | 10/2005 |

(Continued)

OTHER PUBLICATIONS

Sze, "The Thin Film Transistor (TFT)," Semiconductor Devices Physics and Technology, p. 210.

*Primary Examiner* — Kimberly Rizkallah
*Assistant Examiner* — Maria Ligai
(74) *Attorney, Agent, or Firm* — Eric J. Robinson; Robinson Intellectual Property Law Office, P.C.

(57) ABSTRACT

A photoelectric conversion device includes: a first substrate of which end portions are cut off so as to slope or with a groove shape; a photodiode and an amplifier circuit over the first substrate; a first electrode electrically connected to the photodiode and provided over one end portion of the first substrate; a second electrode electrically connected to the amplifier circuit and provided over an another end portion of the first substrate; and a second substrate having third and fourth electrodes thereon. The first and second electrodes are attached to the third and fourth electrodes, respectively, with a conductive material provided not only at the surfaces of the first, second, third, and fourth electrodes facing each other but also at the side surfaces of the first and second electrodes to increase the adhesiveness between a photoelectric conversion device and a member on which the photoelectric conversion device is mounted.

16 Claims, 29 Drawing Sheets

(56) References Cited

U.S. PATENT DOCUMENTS

| | | |
|---|---|---|
| 5,488,765 A | 2/1996 | Kubota et al. |
| 5,501,989 A | 3/1996 | Takayama et al. |
| 5,589,694 A | 12/1996 | Takayama et al. |
| 5,604,328 A | 2/1997 | Kubota et al. |
| 5,625,935 A | 5/1997 | Kubota et al. |
| 5,635,669 A | 6/1997 | Kubota et al. |
| 5,635,670 A | 6/1997 | Kubota et al. |
| 5,644,107 A | 7/1997 | Kubota et al. |
| 5,744,822 A | 4/1998 | Takayama et al. |
| 5,821,597 A | 10/1998 | Nakajima et al. |
| RE36,446 E | 12/1999 | Lumbard et al. |
| 6,171,961 B1 | 1/2001 | Yamazaki et al. |
| 6,383,835 B1 | 5/2002 | Hata et al. |
| 6,436,827 B1 | 8/2002 | Yamazaki et al. |
| 6,440,822 B1 | 8/2002 | Hayama et al. |
| 6,459,132 B1 | 10/2002 | Mochizuki |
| 6,500,760 B1 | 12/2002 | Peterson et al. |
| 6,607,938 B2 | 8/2003 | Kwon et al. |
| 6,611,049 B2 | 8/2003 | Kobayakawa |
| 6,642,081 B1 | 11/2003 | Patti |
| 6,720,576 B1 | 4/2004 | Nakajima et al. |
| 6,747,290 B2 | 6/2004 | Yamazaki et al. |
| 6,754,950 B2 | 6/2004 | Furukawa et al. |
| 6,777,746 B2 | 8/2004 | Kitagawa et al. |
| 6,777,767 B2 | 8/2004 | Badehi |
| 6,790,706 B2 | 9/2004 | Jeung et al. |
| 6,835,601 B2 | 12/2004 | Wajima |
| 6,858,872 B2 | 2/2005 | Kondo |
| 6,891,576 B2 | 5/2005 | Zhang |
| 6,913,950 B2 | 7/2005 | Kobayakawa |
| 6,995,753 B2 | 2/2006 | Yamazaki et al. |
| 7,030,551 B2 | 4/2006 | Yamazaki et al. |
| 7,042,052 B2 | 5/2006 | Bhattacharyya |
| 7,042,099 B2 | 5/2006 | Kurashima et al. |
| 7,068,246 B2 | 6/2006 | Yamazaki et al. |
| 7,095,090 B2 | 8/2006 | Nakajima et al. |
| 7,163,854 B2 | 1/2007 | Yamazaki et al. |
| 7,253,391 B2 | 8/2007 | Koyama et al. |
| 7,335,951 B2 | 2/2008 | Nishi et al. |
| 7,449,718 B2 | 11/2008 | Nishi et al. |
| 7,470,580 B2 | 12/2008 | Yamazaki et al. |
| 7,501,306 B2 | 3/2009 | Nishi et al. |
| 7,919,779 B2 | 4/2011 | Nishi et al. |
| 7,923,800 B2 * | 4/2011 | Hirose et al. ............ 257/433 |
| 8,039,782 B2 | 10/2011 | Koyama et al. |
| 2002/0053742 A1 | 5/2002 | Hata et al. |
| 2002/0070384 A1 * | 6/2002 | Clark et al. ............ 257/79 |
| 2004/0042707 A1 | 3/2004 | Imai et al. |
| 2005/0116310 A1 * | 6/2005 | Nishi et al. ............ 257/440 |
| 2006/0186497 A1 * | 8/2006 | Nishi et al. ............ 257/428 |
| 2007/0121273 A1 | 5/2007 | Yamamoto et al. |
| 2007/0187790 A1 * | 8/2007 | Takahashi et al. ...... 257/433 |
| 2008/0108205 A1 | 5/2008 | Nishi et al. |
| 2008/0166832 A1 * | 7/2008 | Young et al. ............ 438/73 |
| 2012/0025064 A1 | 2/2012 | Koyama et al. |

FOREIGN PATENT DOCUMENTS

| | | |
|---|---|---|
| EP | 2256807 A | 12/2010 |
| JP | 56-013777 A | 2/1981 |
| JP | 02-163950 A | 6/1990 |
| JP | 05-326618 | 12/1993 |
| JP | 06-275808 | 9/1994 |
| JP | 06-342930 A | 12/1994 |
| JP | 08-078329 | 3/1996 |
| JP | 09-129780 | 5/1997 |
| JP | 2000-196117 A | 7/2000 |
| JP | 2001-036097 | 2/2001 |
| JP | 2001-068513 | 3/2001 |
| JP | 2002-062856 | 2/2002 |
| JP | 2003-060744 | 2/2003 |
| JP | 2005-129909 A | 5/2005 |
| WO | WO-2004/068582 | 8/2004 |

\* cited by examiner

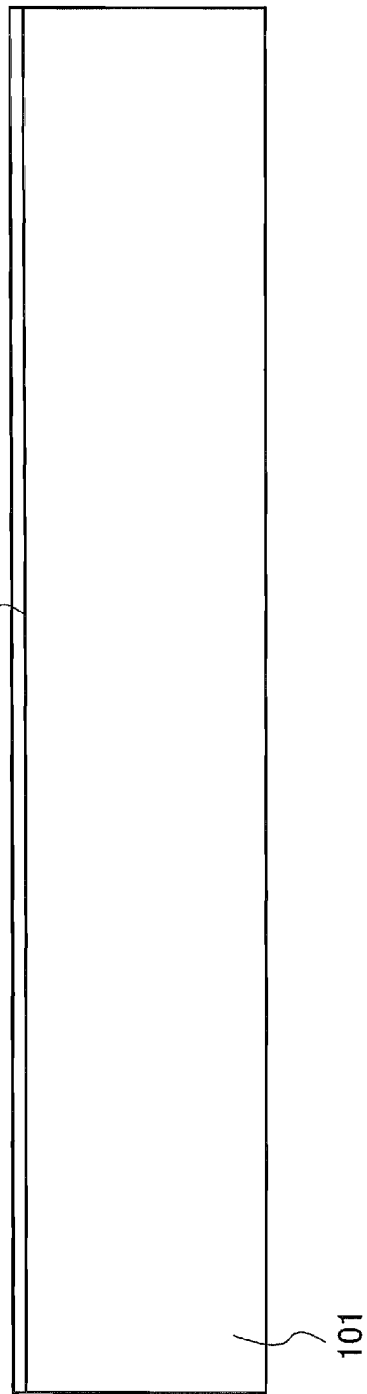

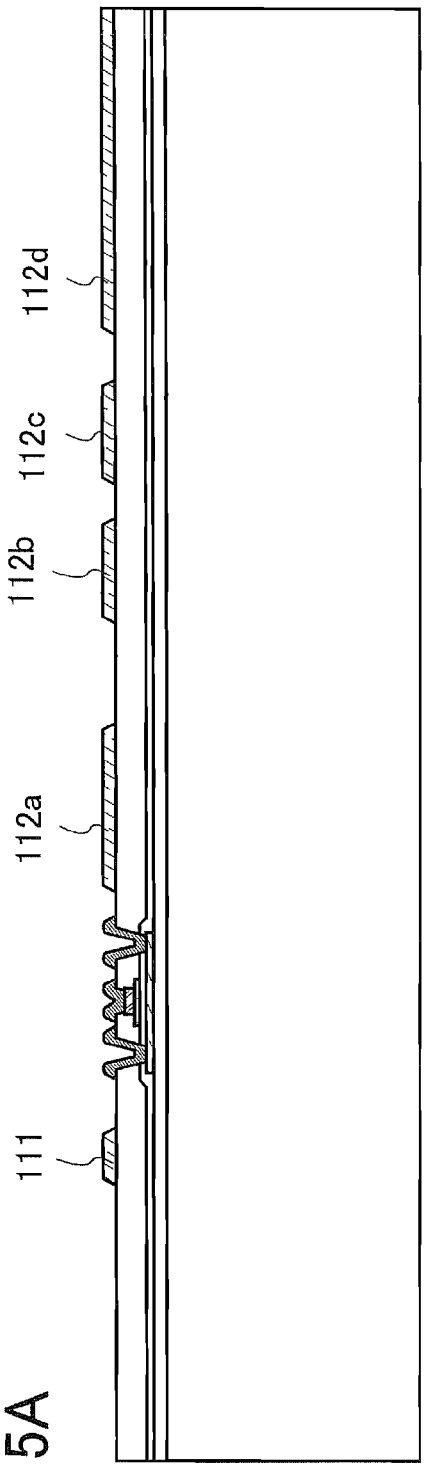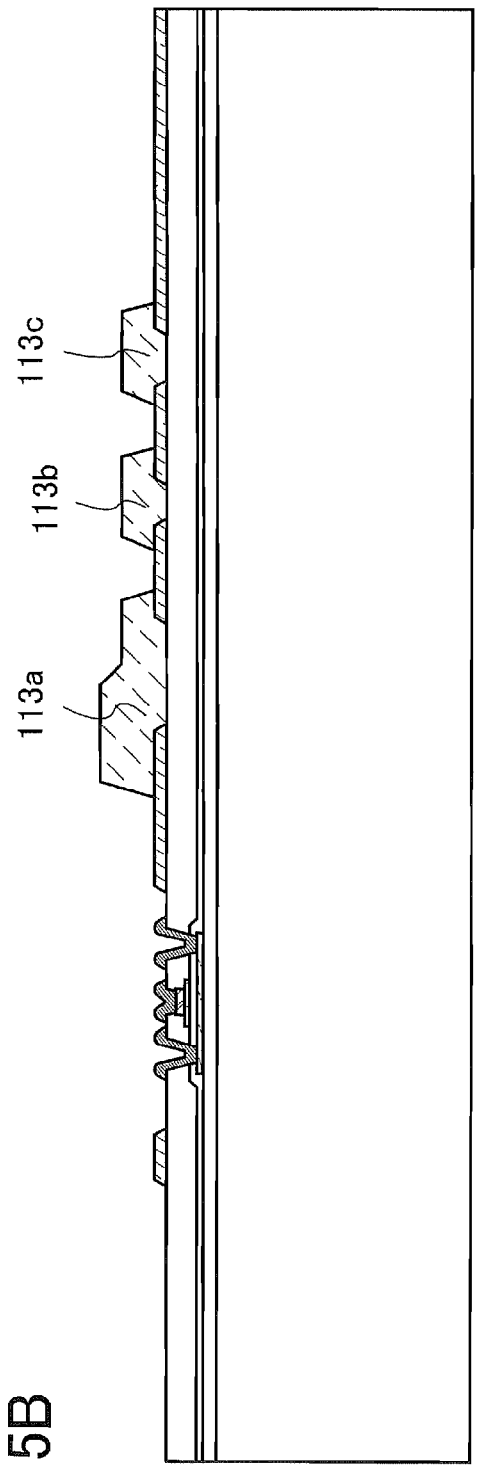

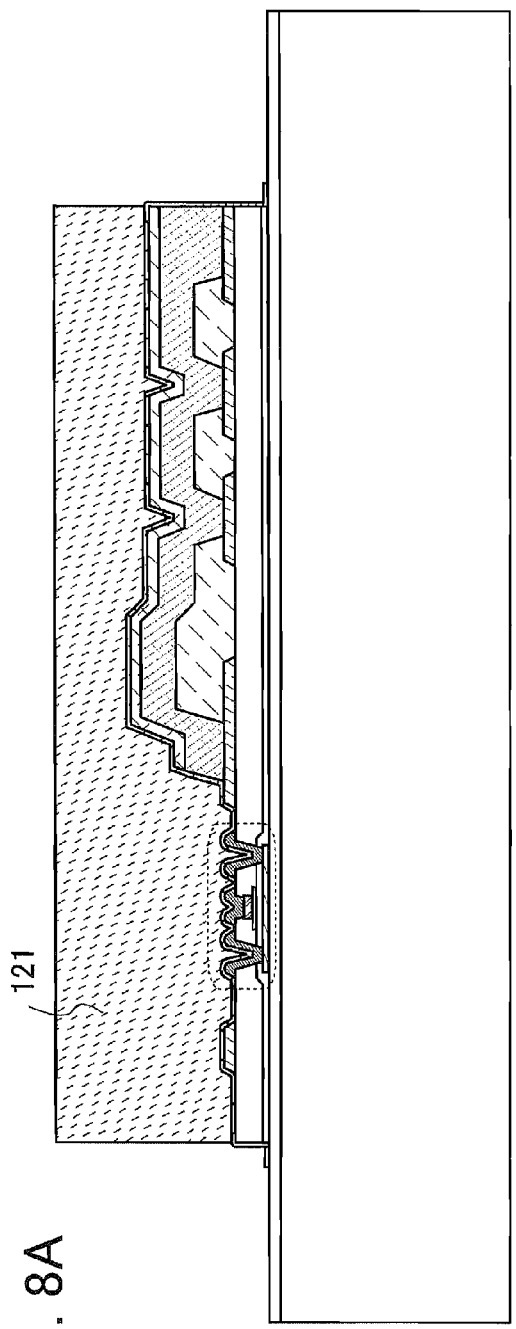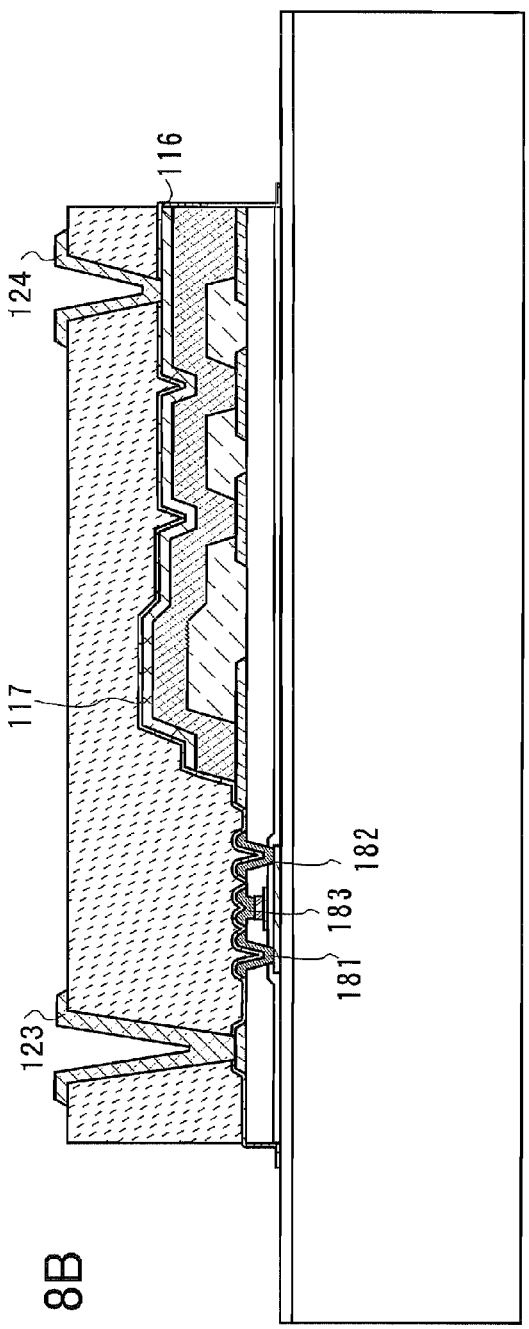

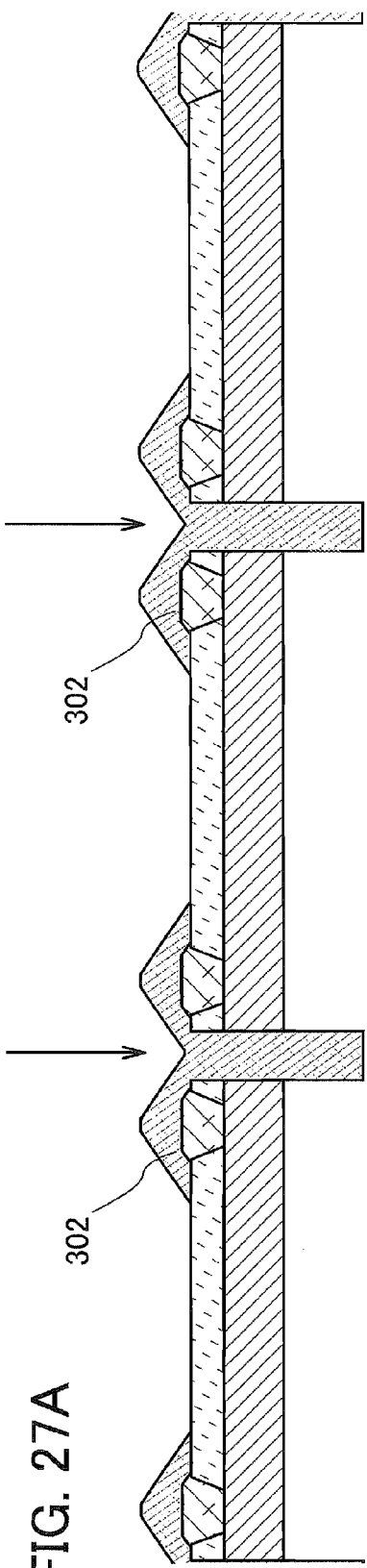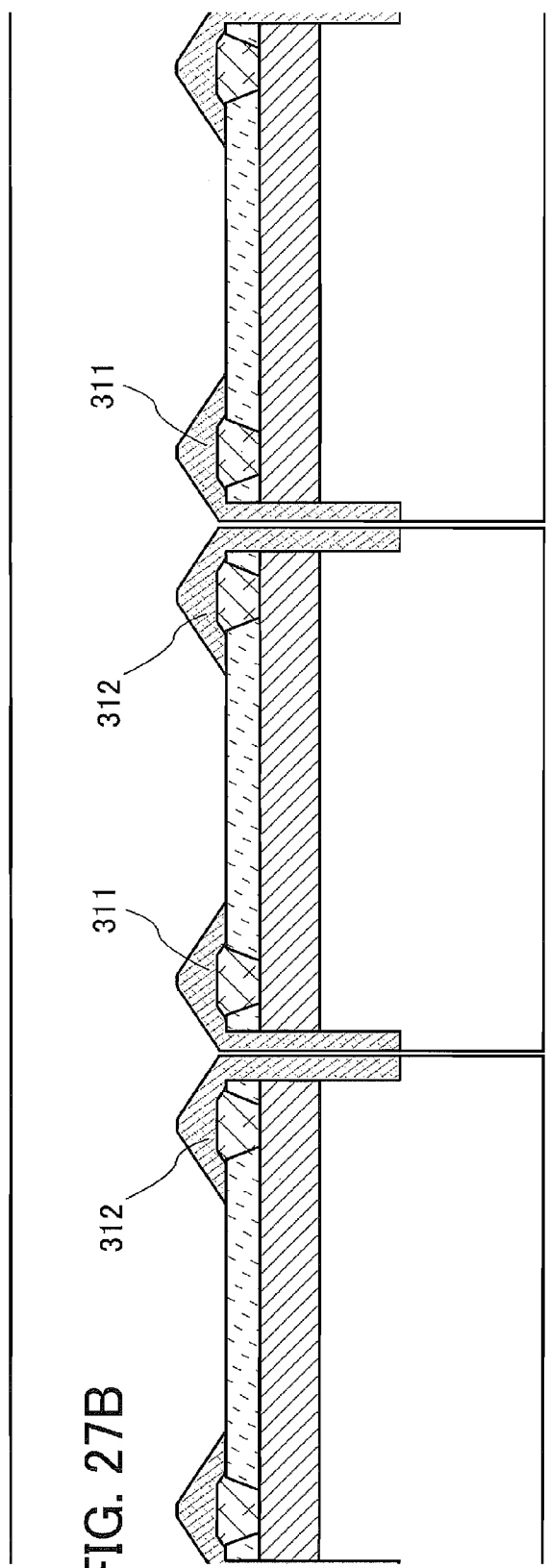

PHOTOELECTRIC CONVERSION DEVICE AND ELECTRONIC DEVICE, AND METHOD FOR MANUFACTURING PHOTOELECTRIC CONVERSION DEVICE

BACKGROUND OF THE INVENTION

1. Field of the Invention

The present invention relates to photoelectric conversion devices formed using a semiconductor, electronic devices equipped with the photoelectric conversion devices, and methods for manufacturing the photoelectric conversion devices.

2. Description of the Related Art

Photoelectric conversion devices which detect visible light having a wavelength range of from 400 nm to 700 nm are referred to as optical sensors or visible optical sensors. Optical sensors or visible optical sensors are known to be used for, for example, detecting optical signals to reading data, detecting ambient brightness to control operation of electronic devices, and the like.

For example, in cellular phones or television units, optical sensors are used for controlling the luminance of display screens in accordance with the ambient brightness of places where they are set (see Reference 1: Japanese Published Patent Application No. 2002-62856).

FIG. 3A shows the structure of an optical sensor disclosed in Reference 1. A photoelectric conversion layer 1603 is provided over a substrate 1601 between a light reflective electrode 1604b and a light-transmitting electrode 1602 provided with openings 1605 and 1606. The photoelectric conversion layer 1603 including p-i-n junction, the light-transmitting electrode 1602, and the light reflective electrode 1604b are combined to form a diode. That is, a configuration of a two-terminal element is obtained. One external connection terminal is a light reflective electrode 1604a connected to the light-transmitting electrode 1602 through an opening 1607 provided in the photoelectric conversion layer 1603, and the other external connection terminal is the light reflective electrode 1604b. Light is received on the light-transmitting substrate 1601 side, and the light transmitted through the substrate 1601 enters the photoelectric conversion layer 1603.

FIG. 3B illustrates an optical sensor in which a light reflective electrode 1611, a photoelectric conversion layer 1612, and a light-transmitting electrode 1613 are provided in this order over a substrate 1610. The optical sensor has a structure in which light enters the photoelectric conversion layer 1612 from the light-transmitting electrode 1613 side. Through holes are provided in the light reflective electrode 1611 and the photoelectric conversion layer 1612 and openings 1614 and 1615 are provided. So, end portions of the substrate 1610 are separated to prevent a short circuit. The light-transmitting electrode 1613 and a light-transmitting electrode 1619 are electrically isolated by an insulating layer 1616 provided over the photoelectric conversion layer 1612. An external connection terminal 1617 is provided in contact with the light-transmitting electrode 1619, and is electrically connected to the light reflective electrode 1611 in an opening formed in the photoelectric conversion layer 1612. An external connection terminal 1618 is provided in contact with the light-transmitting electrode 1613.

FIG. 3C illustrates a mode in which the optical sensor shown in FIG. 3A is mounted on a wiring substrate 1800. The wiring substrate 1800 and the optical sensor are fixed to each other with a UV-carable resin or a thermosetting resin 1852 such that a wiring 1850 is opposed to the light reflective electrodes 1604a and 1604b which are external connection terminals. The light reflective electrodes 1604a and 1604b are electrically connected to the wiring 1850 through conductive particles 1851. Further, FIG. 3D illustrates a mode in which the optical sensor shown in FIG. 3B is mounted on the wiring substrate 1800. The wiring substrate 1800 is attached to the optical sensor with a conductive material 1853 of cream solder, silver paste, or the like such that the wiring 1850 is opposed to the external connection terminals 1617 and 1618.

The optical sensor shown in FIG. 3C is implemented in a manner in which the optical sensor is attached to the wiring substrate 1800 only at the surface over which the light reflective electrodes 1604a and 1604b are formed. Further, the optical sensor shown in FIG. 3D is implemented in a manner in which the external connection terminals 1617 and 1618 are attached to the wiring substrate 1800 only with the conductive material 1853. However, with such structures, there has been a problem in that when bending stress is applied to the wiring substrate 1800, poor contact would be caused in the terminal area, which may separate the optical sensor from the wiring substrate 1800.

SUMMARY OF THE INVENTION

In view of the above, it is one of objects of the present invention to improve adhesiveness between a wiring substrate or the like and a photoelectric conversion device such as an optical sensor, which is mounted on the wiring substrate, thereby solving the problems of poor contact, separation, and the like.

One aspect of a photoelectric conversion element in accordance with the present invention includes a photodiode receiving light and an amplifier circuit for amplifying output of the photodiode, which are provided on a surface of a substrate having an insulating surface; an insulating layer covering the photodiode and the amplifier circuit; a first output terminal connected to the photodiode and a second output terminal connected to the amplifier circuit, which are provided on a surface of the insulating layer covering the photodiode and the amplifier circuit; and first and second connection electrodes each connected to each of the first and second output terminals, wherein each of the first and second connection electrodes continuously extends from a top surface of the insulating layer to a side surface of the insulating layer and a portion of a side surface of the substrate.

One aspect of a photoelectric conversion element in accordance with the present invention includes a photoelectric conversion element including a photodiode receiving light and an amplifier circuit for amplifying output of the photodiode, which are provided on a surface of a substrate having an insulating surface; an insulating layer covering the photodiode and the amplifier circuit; a first output terminal connected to the photodiode and a second output terminal connected to the amplifier circuit, which are provided on a surface of the insulating layer covering the photodiode and the amplifier circuit; and first and second connection electrodes each connected to the first and second output terminals. The substrate has tapered portions sloping inward from side surfaces to said surface, and the first and second connection electrodes continuously extend from portions of top surface of the insulating layer to portions of side surfaces of the substrate along the tapered portions, respectively.

One aspect of a method for manufacturing a photoelectric conversion element includes the steps of forming a photodiode receiving light and an amplifier circuit which amplifies output of the photodiode over a substrate having an insulating surface; forming an insulating layer covering the amplifier circuit and the photodiode; forming first and second output terminals over the insulating layer, the first output terminal connected to the photodiode and the second output terminal connected to the amplifier circuit; and forming first and second connection electrodes each connected to each of the first and second output terminals, wherein the first and second connection electrodes continuously extend from portions of top surface of the insulating layer to portions of side surfaces of the substrate, respectively.

One aspect of the present invention includes a method for manufacturing a photoelectric conversion device, comprising the steps of forming a photodiode receiving light and a plurality of integrated circuits including an amplifier circuit for amplifying output of the photodiode, over a surface of a substrate having an insulating surface; forming an insulating layer covering the plurality of integrated circuits; forming first and second output terminals over the insulating surface for each of the plurality of integrated circuits, first output terminal connected to the photodiode and the second output terminal connected to the amplifier circuit; forming V-shaped grooves between integrated circuits, each of V-shaped grooves extending from the insulating surface to the substrate; forming first and second connection electrodes covering a top surface of the insulating layer and filling the V-shaped grooves, the first and second connection electrodes each being connected to the first and second output terminals; and dividing the plurality of integrated circuits at the approximate center of each V-shaped groove.

The photodiode has a structure in which a p-type semiconductor layer, an i-type semiconductor layer, and an n-type semiconductor layer are stacked.

The amplifier circuit is a current mirror circuit.

Further, the current mirror circuit includes a thin film transistor.

In accordance with the present invention, high adhesiveness between a substrate and a photoelectric conversion element prevents separation between the substrate and the photoelectric conversion element. That improves reliability of a photoelectric conversion device.

Further, in accordance with the present invention, a conductive material used to attach the photoelectric conversion element to the substrate is formed to extend to side surfaces, so that the photoelectric conversion element can be attached to the substrate in a balanced manner, which makes it possible to mount the photoelectric conversion element horizontally on the substrate. Thus, a highly reliable photoelectric conversion device can be obtained.

The provision of the above described photoelectric conversion device on an electronic device makes it possible to detect incident light and suppress power consumption.

BRIEF DESCRIPTION OF THE DRAWINGS

In the accompanying drawings:

FIGS. 4A and 4B are cross-sectional views illustrating manufacturing steps of a photoelectric conversion device of the present invention;

FIGS. 5A and 5B are cross-sectional views illustrating manufacturing steps of a photoelectric conversion device of the present invention;

FIGS. 8A and 8B are cross-sectional views illustrating manufacturing steps of a photoelectric conversion device of the present invention;

FIGS. 27A and 27B are cross-sectional views illustrating manufacturing steps of a photoelectric conversion device of the present invention;

DETAILED DESCRIPTION OF THE INVENTION

Figure 1:
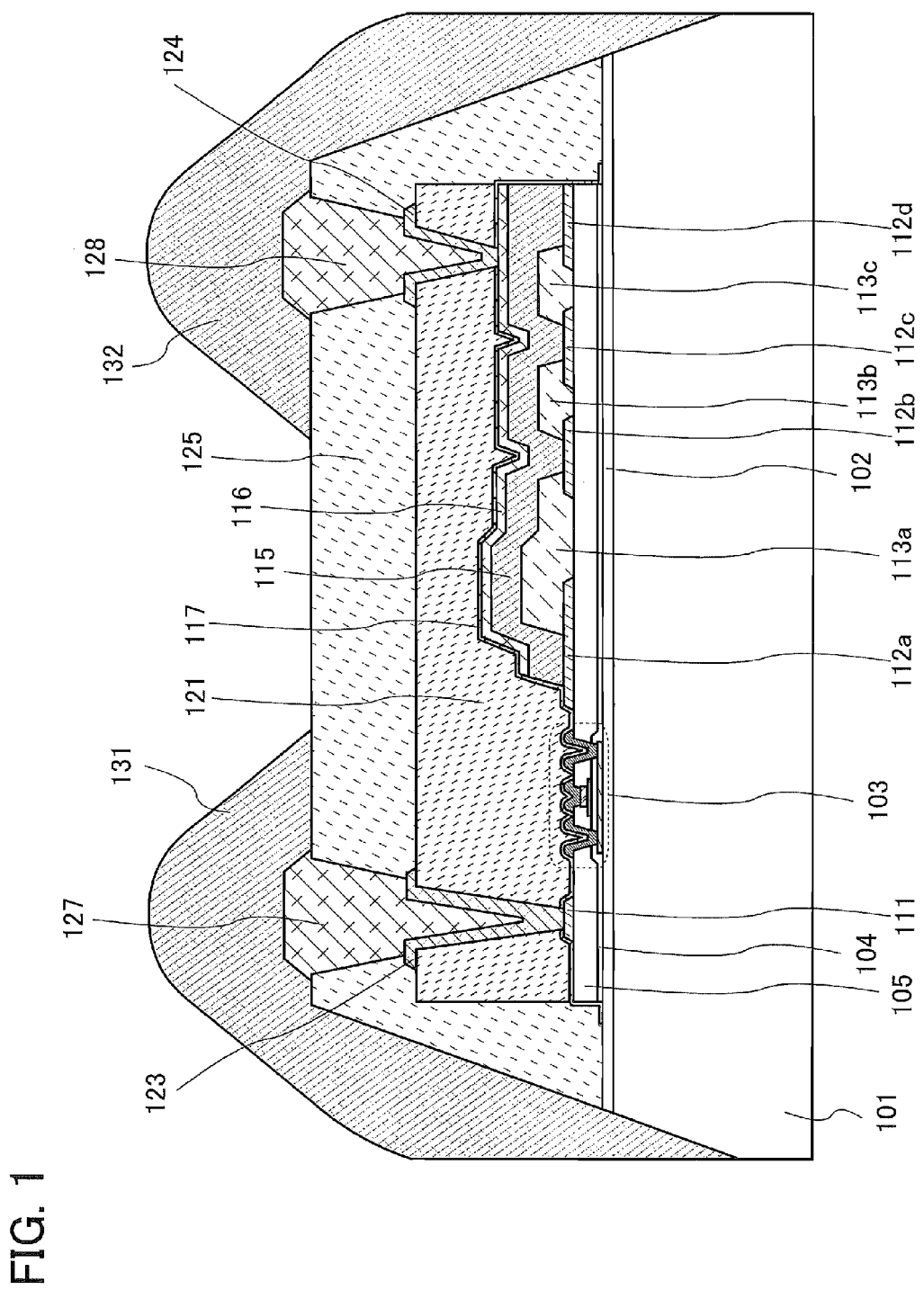
FIG. 1 is a cross-sectional view of a photoelectric conversion device of the present invention.

Hereinafter, embodiment modes of the present invention will be explained with reference to the drawings. Note that it will be readily appreciated by those skilled in the art that forms and details of the invention can be changed in various ways without departing from the spirit and scope of the invention. Therefore, the present invention should not be construed as being limited to the content of the embodiment modes of the invention. Note that like portions and portions which have similar functions are denoted by the same reference numerals throughout the drawings for illustrating the embodiment modes of the present invention, and description thereof will not be repeated.

Embodiment Mode 1

This embodiment mode will be described with reference to FIG. 1, FIGS. 2A and 2B, FIGS. 4A and 4B, FIGS. 5A and 5B, FIGS. 6A and 6B, FIGS. 7A and 7B, FIGS. 8A and 8B, FIG. 9, FIG. 10, FIG. 11, FIG. 12, FIG. 13, FIG. 14, FIG. 15, FIG. 16, FIG. 17A to FIG. 17D, FIG. 18, FIG. 19, and FIG. 20.

First, an insulating film 102 is formed over a substrate 101 (see FIG. 4A). As the substrate 101, a light-transmitting substrate, for example, a glass substrate or a quartz substrate can be used. In this embodiment mode, a glass substrate is used as the substrate 101.

As the insulating film 102, a film formed from silicon oxide, silicon oxide including nitrogen, silicon nitride, silicon nitride including oxygen, or a metal oxide material may be formed by sputtering or plasma CVD.

Alternatively, the insulating film 102 may be formed from two layers of a lower-layer insulating film and an upper-layer insulating film. A silicon nitride film containing oxygen ($SiO_xN_y$:y>x), for example, may be used as the lower-layer insulating film, and a silicon oxide film containing nitrogen ($SiO_xN_y$:x>y), for example, may be used as the upper-layer insulating film. When the insulating film 102 has two layers, contaminants such as moisture can be prevented from entering from the substrate 101 side.

Figure 17A:
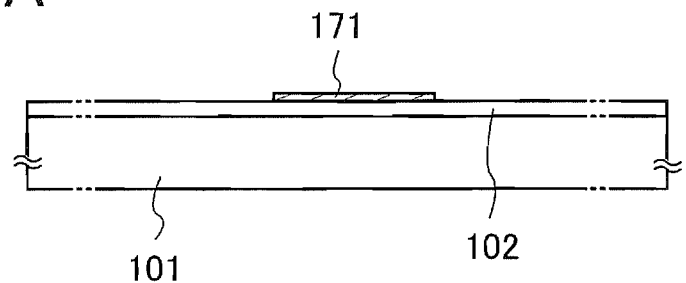
FIGS. 17A to 17D are cross-sectional views illustrating manufacturing steps of a photoelectric conversion device of the present invention.

Next, a crystalline semiconductor film is etched into an island shape to form an island-shaped semiconductor film 171 (see FIG. 17A).

Note that FIG. 17A to FIG. 17D are diagrams which illustrate only an area around a TFT 103 in details.

Figure 17B:
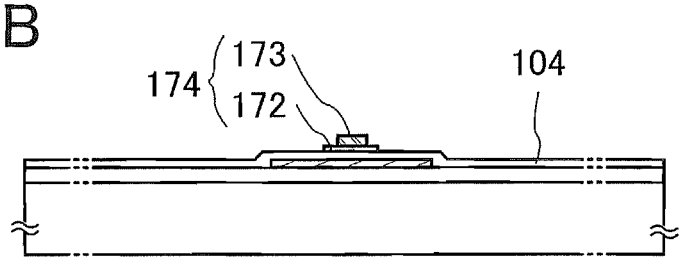

In the island-shaped semiconductor film 171, a source region, a drain region, and a channel region are formed. A gate insulating film 104 covering the island-shaped semiconductor film 171, and a lower-layer gate electrode 172 and an upper-layer gate electrode 173 which are formed over the channel region in the island-shaped semiconductor film 171 are provided (see FIG. 17B). In FIG. 17B, the gate electrode has a two-layer structure of the lower-layer gate electrode 172 and the upper-layer gate electrode 173; however, a gate electrode having a single-layer structure may be formed instead. The lower-layer gate electrode 172 and the upper-layer gate electrode 173 are collectively referred to as a gate electrode 174.

Note that in this embodiment mode, the TFT 103 is formed as a top-gate type TFT; however, it may be a bottom-gate type TFT. Alternatively, a single-gate TFT having one channel region or a multi-gate TFT having a plurality of channel regions may be used.

Figure 17C:
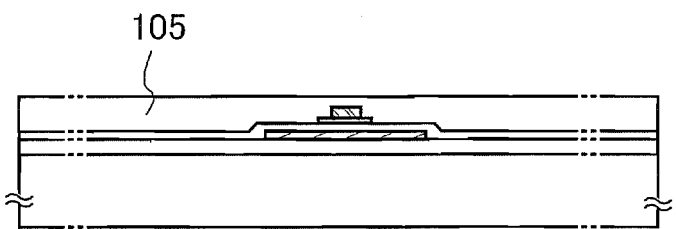

An interlayer insulating film 105 is formed so as to cover the gate insulating film 104 and the gate electrode 174 having the lower-layer gate electrode 172 and the upper-layer gate electrode 173 (see FIG. 17C).

Note that the interlayer insulating film 105 may be formed from a single-layer insulating film, or may be a layer stack having insulating layers of different materials.

Over the interlayer insulating film 105, a source electrode 181 and a drain electrode 182 are formed such that they electrically connect to the source region and the drain region in the island-shaped semiconductor film 171. Further, a gate wiring 183 is formed such that it electrically connects to the gate electrode 174. Thus, the TFT 103 is formed (see FIG. 17D, FIG. 4B).

Figure 17D:
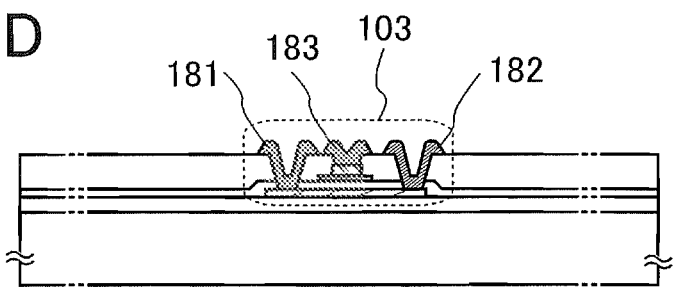

Note that only one TFT is shown in the drawings which illustrate the steps up to and including the step shown in either FIG. 17D or FIG. 4B. However, actually, the TFT 103 is included an amplifier circuit which amplifies photocurrent obtained in a photoelectric conversion layer, for example, a current mirror circuit; therefore, at least two TFTs are formed.

Figure 12:
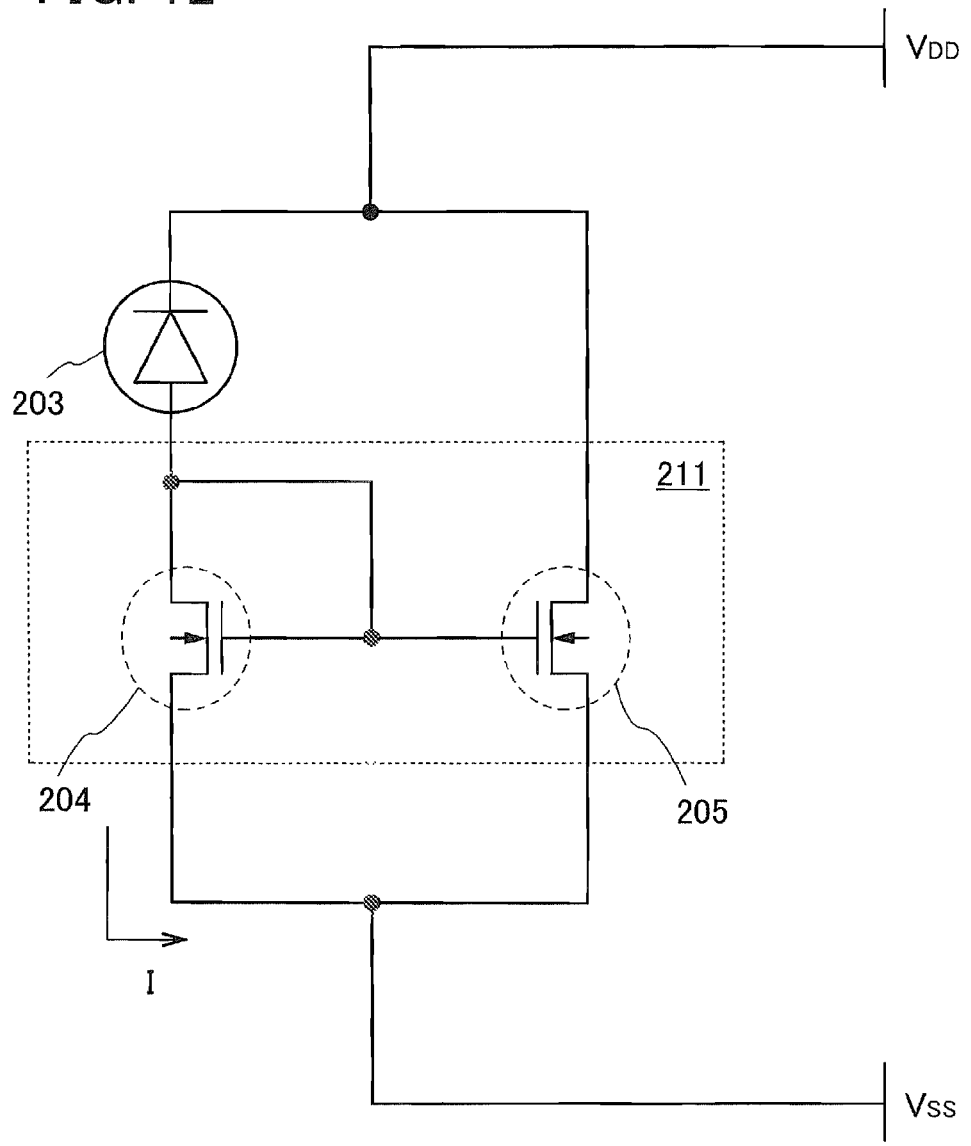
FIG. 12 is a circuit diagram of a photoelectric conversion device of the present invention.

FIG. 12 shows a circuit configuration of a current mirror circuit 211 including a photodiode 203 having a photoelectric conversion layer, a TFT 204, and a TFT 205. The TFT 103 in FIG. 4B and FIG. 17D is one of the TFT 204 and the TFT 205.

In FIG. 12, a gate electrode of the TFT 204 included in the current mirror circuit 211 is electrically connected to a gate electrode of the TFT 205, which is the other of the TFTs included in the current mirror circuit 211, and further, the TFT 205 is electrically connected to a drain electrode (also referred to as "drain terminal") which is one of a source electrode and a drain electrode of the TFT 204.

The drain terminal of the TFT 204 is electrically connected to the photodiode 203, a drain terminal of the TFT 205, and a high potential power supply $V_{DD}$.

The source electrode (also referred to as "source terminal") which is one of the source electrode and the drain electrode of the TFT 204 is electrically connected to a low potential power supply $V_{SS}$ and a source terminal of the TFT 205.

Further, the gate electrode of the TFT 205 included in the current mirror circuit 211 is electrically connected to the gate electrode and the drain terminal of the TFT 204.

In addition, since the gate electrodes of the TFT 204 and the TFT 205 are connected to each other, a common electric potential is applied thereto.

FIG. 12 is a diagram illustrating an example of a current mirror circuit formed from two TFTs. Here, when the TFT 204 and the TFT 205 have the same characteristics, the ratio of the reference current to the output current is 1:1.

Figure 13:
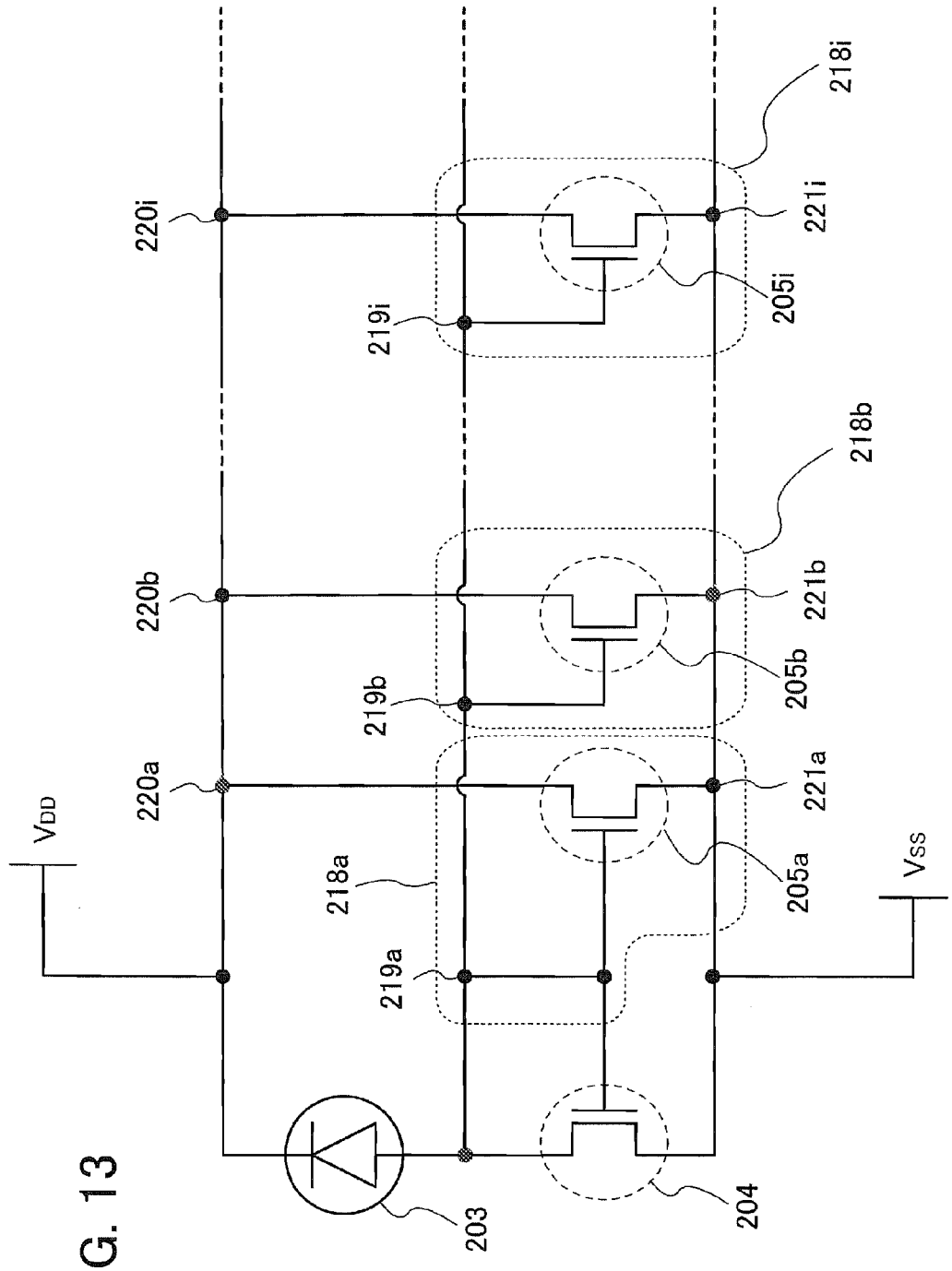
FIG. 13 is a circuit diagram of a photoelectric conversion device of the present invention.

FIG. 13 illustrates circuit configurations with which an output value can be increased n times. The circuit configuration of FIG. 13 corresponds to the configuration of n TFTs 205 in FIG. 12 are provided. When the ratio of the TFT 204 to the TFTs 205 is set at 1:n as shown in FIG. 13, the output value can be increased n times. This serves the same principle as a configuration in which the channel width W of a TFT is increased so as to increase the limit of the current flow through the TFT n times.

For example, in order to increase an output value 100 times as large, the desired current can be obtained by connecting one n-channel TFT 204 and 100 n-channel TFTs 205 in parallel.

FIG. 13 also illustrates a specific circuit configuration of a circuit 218$i$ (e.g., circuits 218$a$, 218$b$, and the like).

A gate electrode of a TFT 205$i$ is electrically connected to a terminal 219$i$, a drain terminal of the TFT 205$i$ is further electrically connected to a terminal 220$i$, and a source terminal of the TFT 205$i$ is electrically connected to a terminal 221$i$.

Since the circuit 218$i$ is based on the circuit configuration of FIG. 12, components that are common to FIGS. 12 and 13 are denoted by common reference numerals.

Reference numerals with "i" in FIG. 13 denote the same components as those without "i" in FIG. 12. That is, the TFT 205 in FIG. 12 and the TFT 205i in FIG. 13, for example, are the same TFTs.

Therefore, the TFT 205 corresponds to n TFTs 205i, and the like in FIG. 13. Accordingly, a current flow through the TFT 204 can be amplified n times to be output.

In addition, although FIG. 12 illustrates an equivalent circuit of the current mirror circuit 211 using n-channel TFTs, the n-channel TFTs may be replaced with p-channel TFTs.

Figure 14:
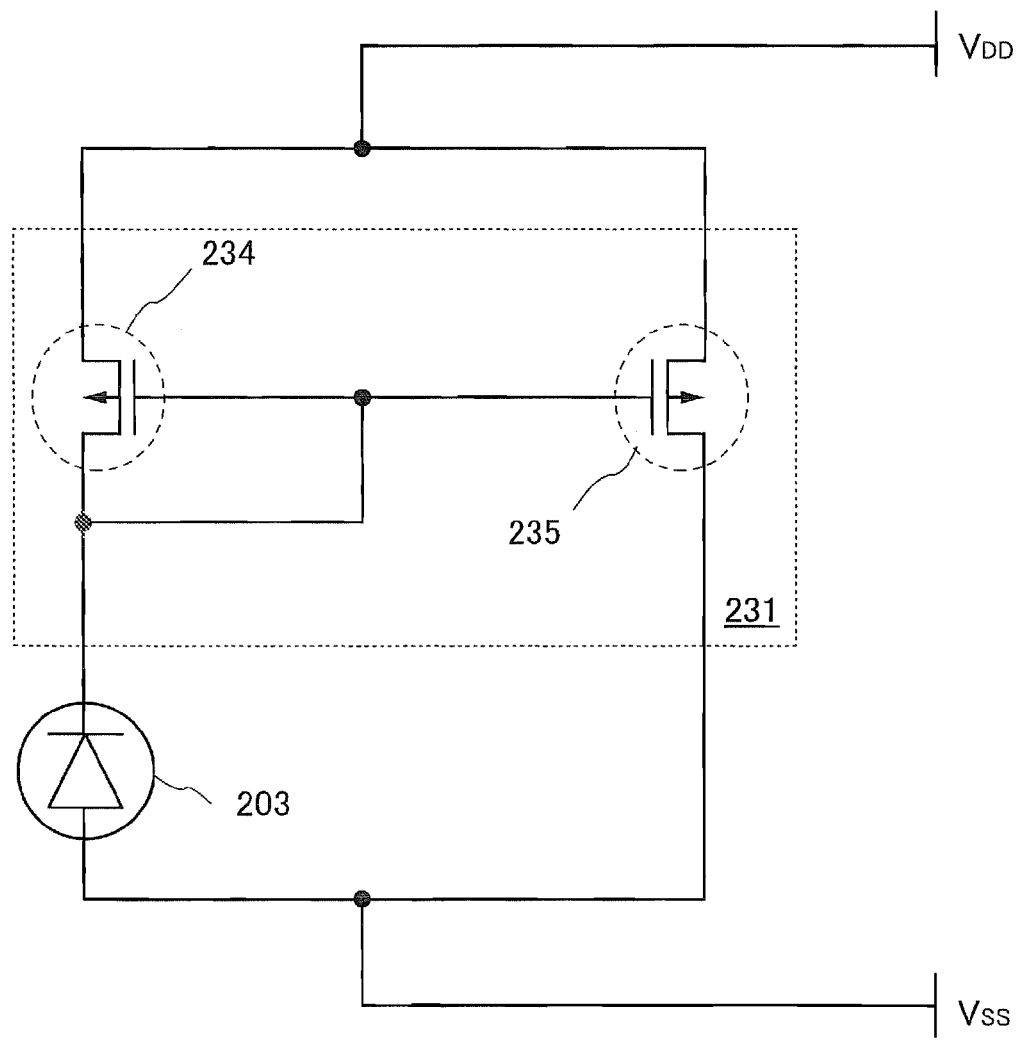
FIG. 14 is a circuit diagram of a photoelectric conversion device of the present invention.

When the amplifier circuit is formed from p-channel TFTs, an equivalent circuit shown in FIG. 14 is obtained. As shown in FIG. 14, a current mirror circuit 231 includes p-channel TFTs 234 and 235. Note that components common to FIGS. 12, 13, and 14 are denoted by common reference numerals.

After the TFT 103 is manufactured as described above (FIG. 4B), electrodes 111 and 112 are formed over the interlayer insulating film 105. FIG. 5A shows a plurality of electrodes 112: an electrode 112a, an electrode 112b, an electrode 112c, an electrode 112d, and the like, whereas only one electrode 112 is formed in FIG. 18.

Note that in this embodiment mode, the electrodes 111 and 112 are formed using a titanium film by depositing titanium (Ti) to a thickness of 400 nm.

Note that the electrodes 111 and 112 may be formed through the same steps as the source electrode 181 and drain electrode 182.

Figure 15:
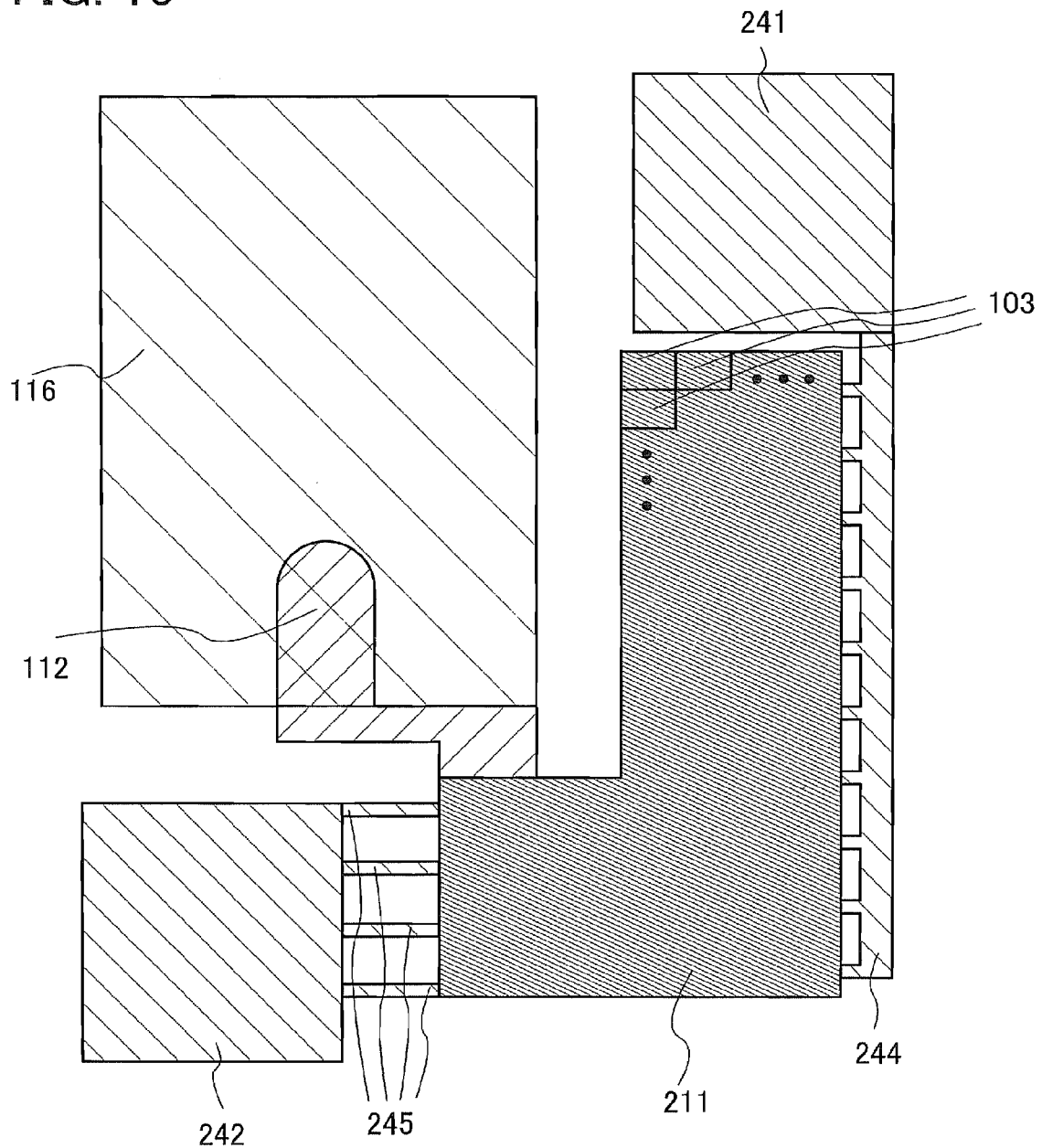
FIG. 15 is a top view of a photoelectric conversion device of the present invention.
Figure 16:
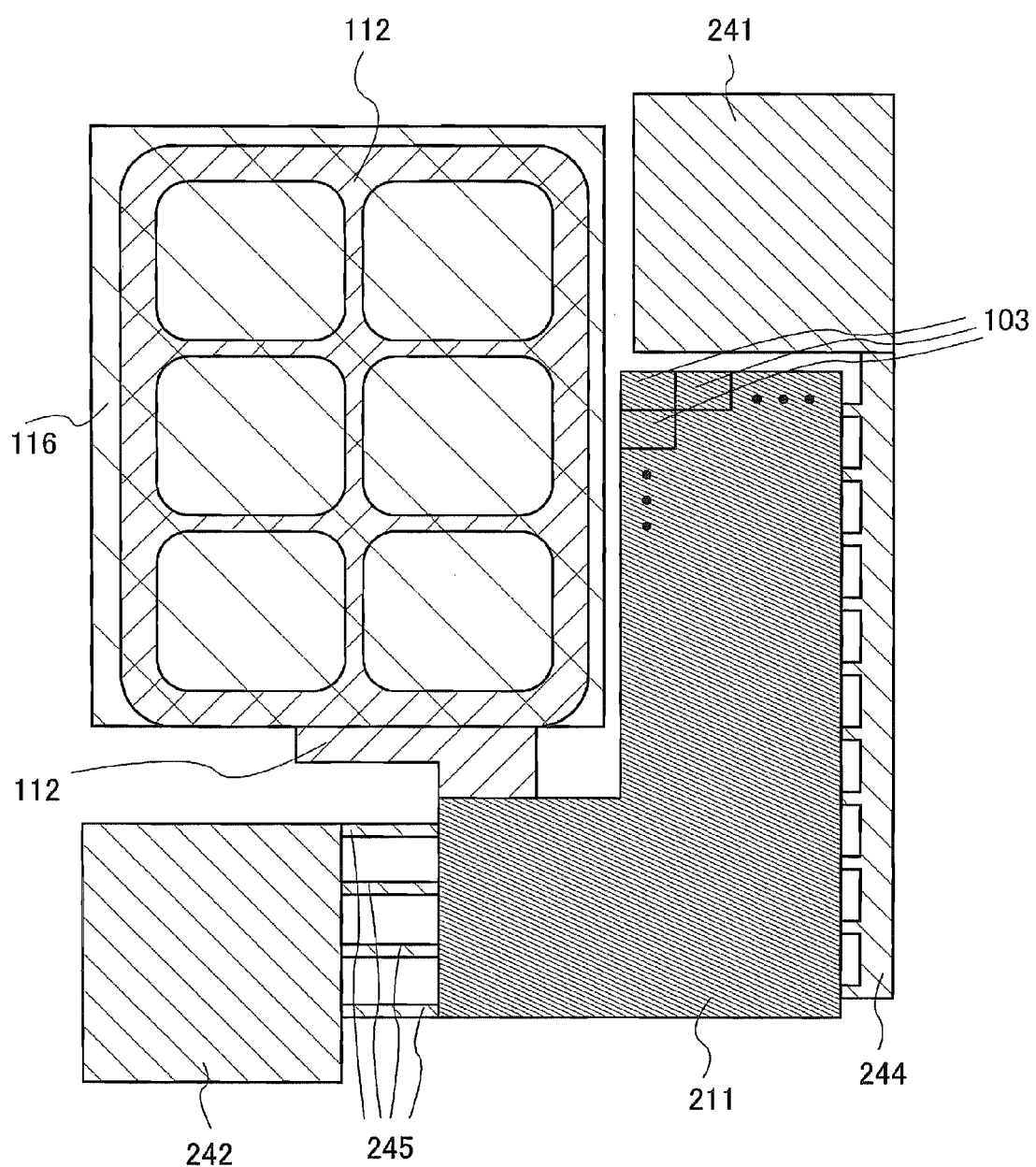
FIG. 16 is a top view of a photoelectric conversion device of the present invention.

FIG. 16 illustrates a top view of the electrode 112 and the periphery thereof in FIG. 5A. FIG. 15 illustrates a top view of the electrode 112 and the periphery thereof in FIG. 18.

In FIG. 16, the electrode 112 is a grid electrode, and a plurality of parts of it is connected to a photoelectric conversion layer which is formed through steps to be later described. Therefore, when a cross section of the electrode 112 (electrodes 112a to 112d) is viewed, as shown in FIG. 5A, a plurality of electrodes seem to be formed; however, actually the electrodes 112 are manufactured from the same material through the same steps. When the electrodes 112 are formed in a grid pattern as shown in FIG. 16, it is advantageous that the resistance value of the photoelectric conversion layer is lowered.

Figure 18:
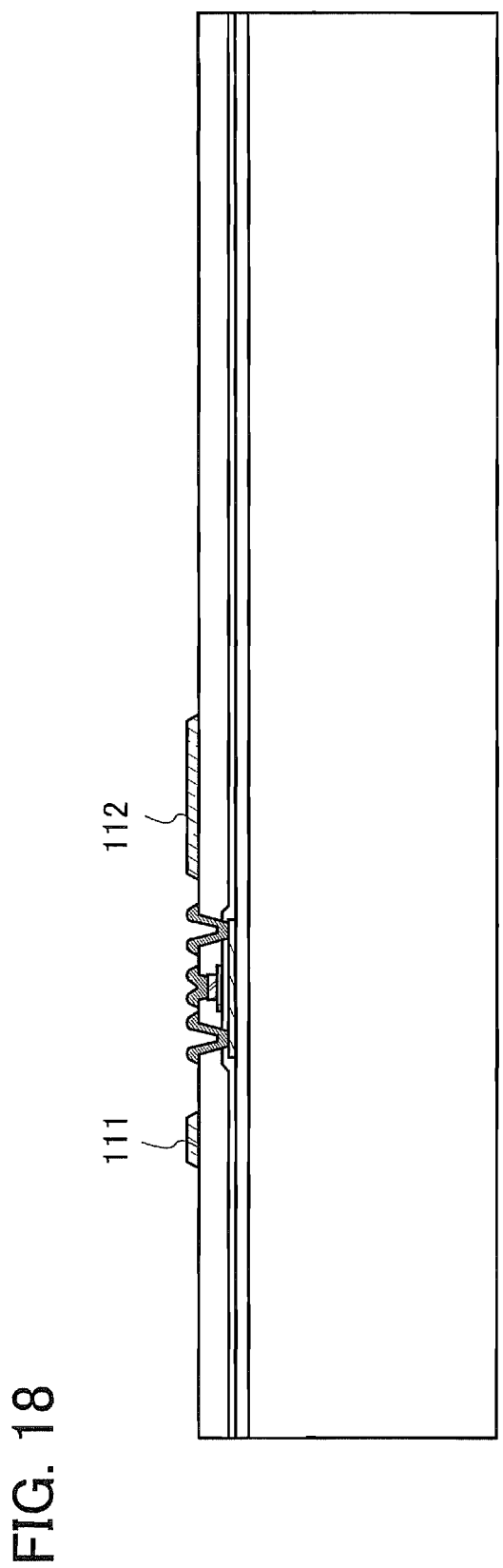
FIG. 18 is a cross-sectional view illustrating a manufacturing step of a photoelectric conversion device of the present invention.

Further, in FIG. 15, since the electrode 112 is an electrode having a rectangular shape with round ends, when the cross section of it is viewed, only one electrode 112 seems to be formed as shown in FIG. 18.

Note that in FIG. 15 and FIG. 16, the electrode 112 is electrically connected to the current mirror circuit 211. The current mirror circuit 211 has two to (n+1) TFTs 103.

Specifically, as described above, when the ratio of reference current to output current of 1:1 is desired, one each of a reference TFT and an output TFT may be formed as shown in the circuit diagram of FIG. 12. Further, when the ratio of reference current to output current of 1:n is desired, one reference TFT and n number of output TFTs may be formed. Circuit diagrams of those cases are shown in FIG. 13.

As described in FIGS. 15 and 16, the current mirror circuit 211 is electrically connected to a connection electrode 241 connected to a high potential power supply $V_{DD}$ through a wiring 244, and further electrically connected to a connection electrode 242 connected to a low potential power supply $V_{SS}$ through a wiring 245. Note that although the connection electrode 242 and the electrode 111 are the selfsame electrode, it is not limited thereto and two electrodes may be formed separately. Also, the connection electrode 241 and the electrodes 111 and 112 are formed by the same manufacturing step using the same material.

Next, as shown in FIG. 5B, an overcoat layer 113 (including overcoat layers 113a, 113b, 113c, and the like) is provided over the electrode 112 and the interlayer insulating film 105. Note that FIG. 5B illustrates a structure in which the overcoat layer 113 is additionally formed in the structure shown in FIG. 5A; however, the structure in FIG. 18 may also be used instead of FIG. 5A.

Further, the overcoat layer 113 may be formed of a light-transmitting insulating material. For example, an organic resin material such as acrylic or polyimide, or an inorganic material such as silicon nitride, silicon oxide, silicon oxide containing nitrogen, or silicon nitride containing oxygen can be used. Moreover, a multi-layered film in which those materials are stacked can be used to form the overcoat layer 113. In this embodiment mode, polyimide is used for the overcoat layer 113.

Figure 6A:
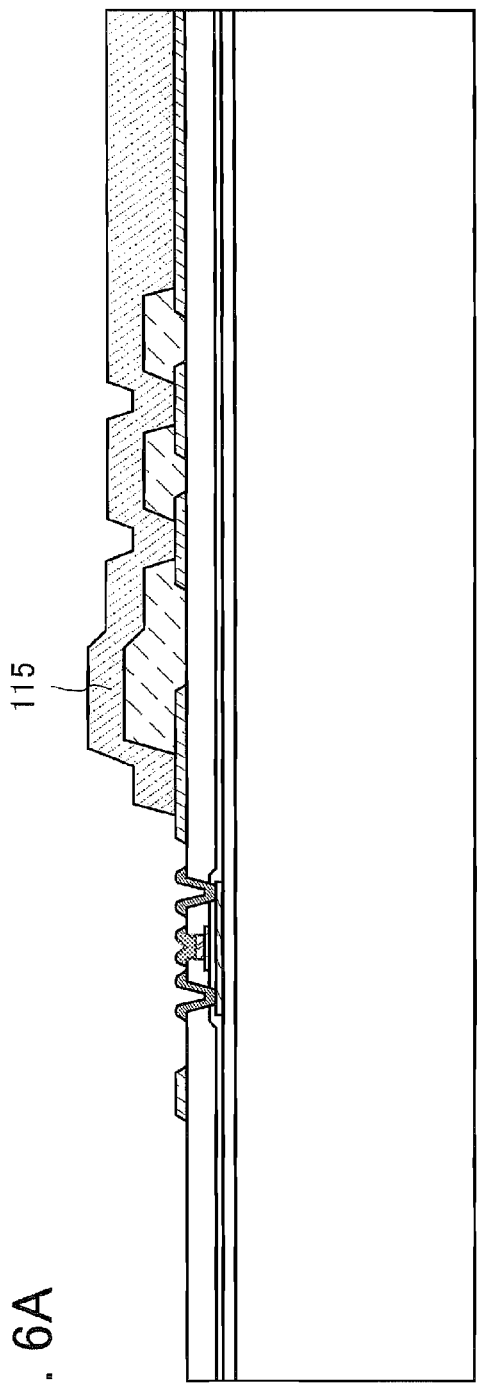
FIGS. 6A and 6B are cross-sectional views illustrating manufacturing steps of a photoelectric conversion device of the present invention.
Figure 19:
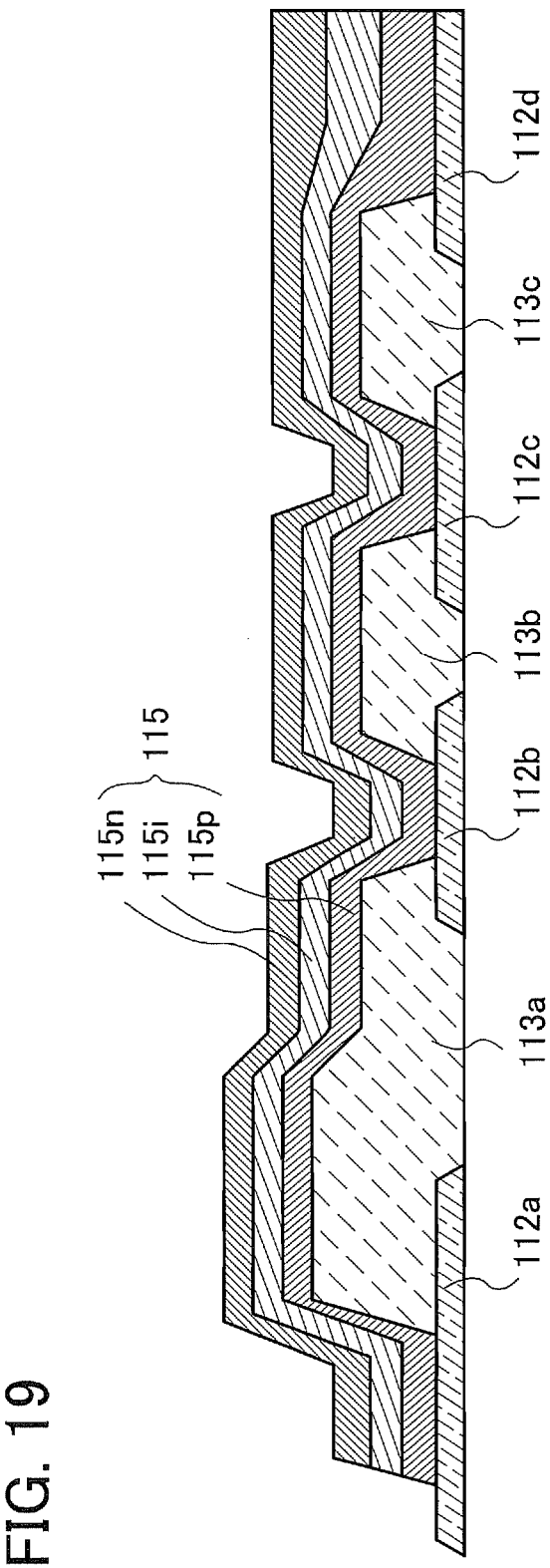
FIG. 19 is a cross-sectional view illustrating a manufacturing step of a photoelectric conversion device of the present invention.

Next, a p-type semiconductor film, an i-type semiconductor film, and an n-type semiconductor film are formed over the electrode 112 and the overcoat layer 113, and etched to form the photoelectric conversion layer 115 having the p-type semiconductor layer 115p, the i-type semiconductor layer 115i, and the n-type semiconductor layer 115n (see FIG. 6A and FIG. 19). Note that a magnified view of the periphery of the photoelectric conversion layer 115 in FIG. 6A is shown in FIG. 19.

Note that the overcoat layer 113 has a function of improving the shape of the photoelectric conversion layer 115 by sloping the ends of the overcoat layer 113 so that a p-type semiconductor layer 115p is not shorted to an n-type semiconductor layer 115n, a function of suppressing mixing of contaminants into the photoelectric conversion layer 115, and a function of adjusting light which enters the photoelectric conversion layer 115.

The p-type semiconductor layer 115p may be formed by depositing an amorphous semiconductor film containing an impurity element of Group 13, e.g., boron (B) by plasma CVD.

In FIG. 19, the electrode 112 (electrodes 112a to 112d) is in contact with the bottom layer of the photoelectric conversion layer 115, i.e., the p-type semiconductor layer 115p in this embodiment mode.

The i-type semiconductor layer 115i may be formed by depositing an amorphous semiconductor film by plasma CVD, for example. The n-type semiconductor layer 115n may be formed either by depositing an amorphous semiconductor film containing an impurity element of Group 15, e.g., phosphorus (P) or by depositing an amorphous semiconductor film and doping the film with an impurity element of Group 15.

Note that an amorphous silicon film, an amorphous germanium film, or the like may be used as the amorphous semiconductor film.

Note that in this specification, an i-type semiconductor film refers to a semiconductor film in which the concentration of an impurity which imparts p-type or n-type conductivity is $1 \times 10^{20}$ cm$^{-3}$ or less, and the concentration of oxygen and nitrogen is $5 \times 10^{19}$ cm$^{-3}$ or less, and the dark conductivity against light conductivity is 100 times or more. Further, 10 ppm to 1000 ppm of boron (B) may be added to the i-type semiconductor film.

Further, other than an amorphous semiconductor film, a microcrystalline semiconductor film (also referred to as a semiamorphous semiconductor film) may be used as the p-type semiconductor layer 115p, the i-type semiconductor layer 115i, and the n-type semiconductor layer 115n.

Alternatively, the p-type semiconductor layer 115p and the n-type semiconductor layer 115n may be formed using a microcrystalline semiconductor film, and the i-type semiconductor layer 115i may be formed using an amorphous semiconductor film.

The semiamorphous semiconductor film is a film containing a semiconductor with an intermediate structure between an amorphous semiconductor and a semiconductor film having a crystal structure (including a single crystal structure and a polycrystalline structure). The semiamorphous semiconductor film is a semiconductor film having a third condition that is stable in term of free energy and is a crystalline substance having a short-range order and lattice distortion. A crystal grain thereof can be dispersed in the non-single crystal semiconductor film by setting a grain size thereof to be 0.5 nm to 20 nm. Raman spectrum thereof is shifted toward lower wave number than 520 cm$^{-1}$. The diffraction peaks of (111) and (220), which are thought to be derived from a Si crystal lattice, are observed in the semiamorphous semiconductor film by X-ray diffraction. Hydrogen or halogen of at least 1 atomic % or more is contained in the semiamorphous semiconductor film for terminating a dangling bond. In this specification, such a semiconductor film is referred to as a semiamorphous semiconductor (SAS) film for the sake of convenience. The lattice distortion is further extended by adding a rare gas element such as helium, argon, krypton, and neon so that the favorable semiamorphous semiconductor film with improved stability can be obtained. It is to be noted that a microcrystal semiconductor film is also included in a semiamorphous semiconductor film.

An SAS film can be obtained by glow discharge decomposition of a gas containing silicon. $SiH_4$ is a typical gas containing silicon, and additionally, $Si_2H_6$, $SiH_2Cl_3$, $SiCl_4$, $SiF_4$, or the like can be used. An SAS film can be easily formed by using the gas containing silicon diluted with hydrogen or gas in which one or more of rare gas elements selected from helium, argon, krypton, and neon is/are added to hydrogen. The gas containing silicon is preferably diluted with a 2 to 1000 fold dilution factor. In addition, a carbide gas such as $CH_4$ or $C_2H_6$; a germanide gas such as $GeH_4$ and $GeF_4$; $F_2$; and the like may be mixed into the gas containing silicon to adjust the width of an energy band at 1.5 eV to 2.4 eV or 0.9 eV to 1.1 eV.

Note that in this specification, the photoelectric conversion layer 115, photodiode 203 including the photoelectric conversion layer 115, and also an element having the photodiode 203 are referred to as a photoelectric conversion element, or a photoelectric conversion device.

Figure 6B:
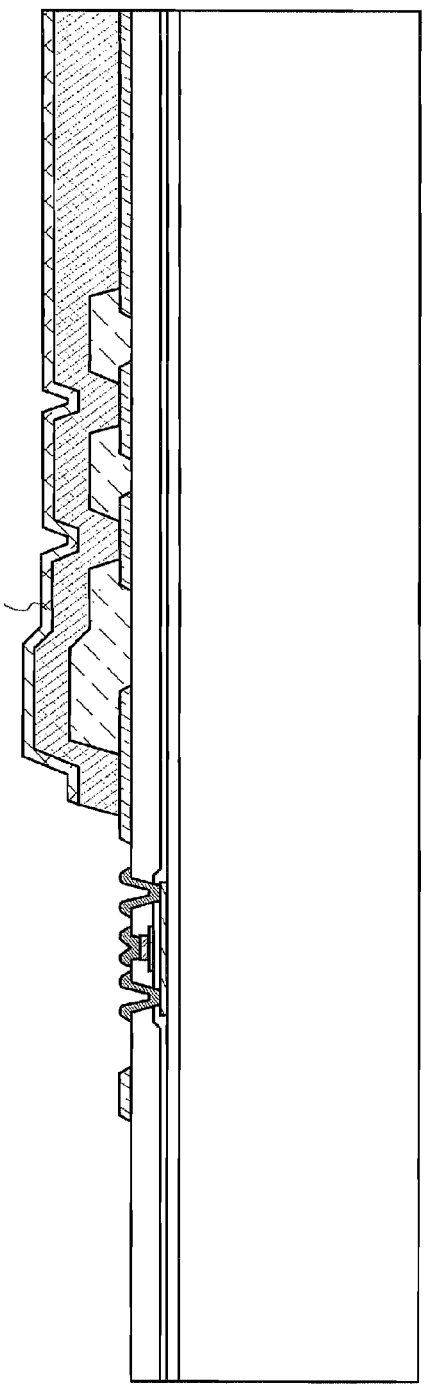

Next, an auxiliary electrode 116 is formed on the top surface of the photoelectric conversion layer 115 (see FIG. 6B). The auxiliary electrode 116 may be formed only when the resistance of the photoelectric conversion layer 115 is high, and if the resistance of the photoelectric conversion layer 115 is low, the auxiliary electrode 116 is not necessarily formed. In this embodiment mode, as the auxiliary electrode 116, titanium (Ti) is formed to a thickness of 20 nm to 30 nm.

Also, as an another manufacturing steps, after the p-type semiconductor film, the i-type semiconductor film, and the n-type semiconductor film are formed, a conductive film to be the auxiliary electrode 116 is formed, and then the conductive film is etched to form the auxiliary electrode 116. Further, the photoelectric conversion layer 115 may be formed by etching the p-type semiconductor film, the i-type semiconductor film, and the n-type semiconductor film.

Figure 7A:
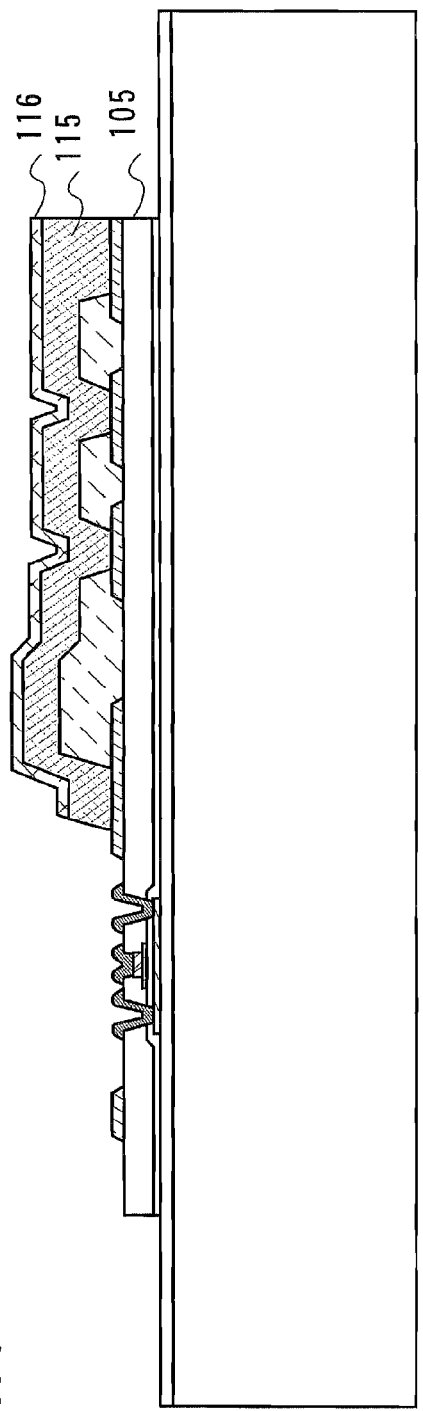
FIGS. 7A and 7B are cross-sectional views illustrating manufacturing steps of a photoelectric conversion device of the present invention.

Next, either end portion of the interlayer insulating film 105, end portions of the photoelectric conversion layer 115, end portions of the auxiliary electrode 116 are etched away (see FIG. 7A). As described above, the photoelectric conversion layer 115 of the photodiode 203 and the TFT 103 included in the current mirror circuit 211 which is an amplifier circuit amplifying the output of the photodiode 203 are formed over the substrate 101.

Figure 7B:
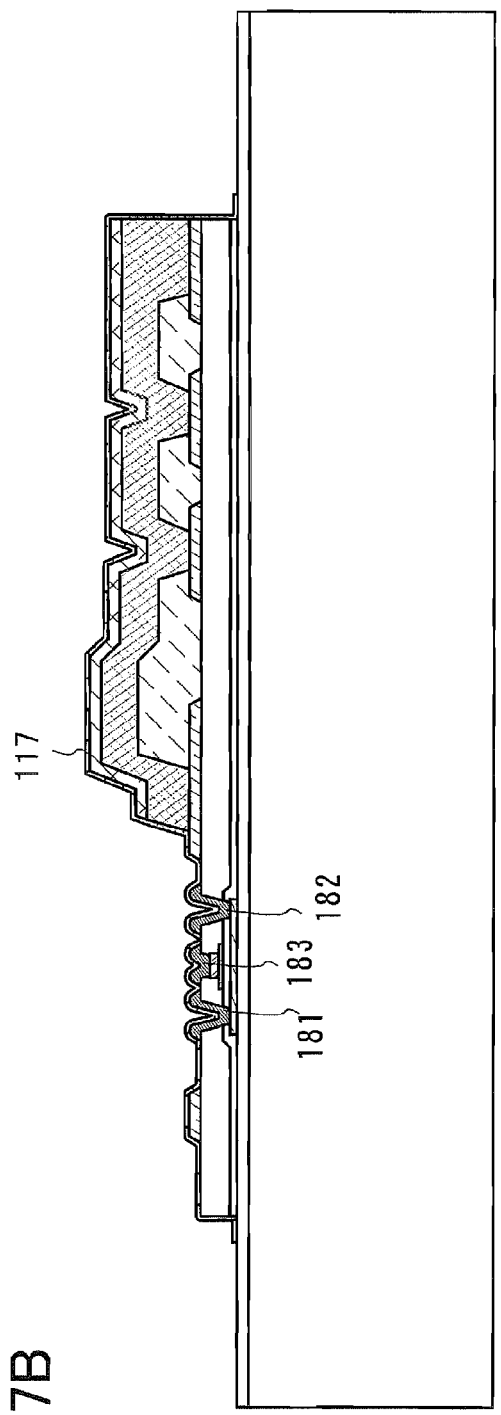

Next, a protective film 117 is formed to cover an exposed surface (see FIG. 7B). As the protective film 117, in this embodiment mode, a silicon nitride film is used. The protective film 117 is for protecting the gate wiring 183, source electrode 181, and drain electrode 182 of the TFT 103 so as not to be etched when an interlayer insulating film 121 in a later step. Further, the protective film 117 makes it possible to prevent mixing of impurities such as moisture and organic matter into the TFT 103 and the photoelectric conversion layer 115.

Next, the interlayer insulating film 121 is formed over the protective film 117 (see FIG. 8A). The interlayer insulating film 121 also serves as a planarization film. In this embodiment mode, polyimide is formed to a thickness of 2 μm as the interlayer insulating film 121.

Next, the interlayer insulating film 121 is etched to form contact holes. At that time, because of the presence of the protective film 117, the gate wiring 183, source electrode 181, and drain electrode 182 of the TFT 103 are not etched. Then, a part of the protective film 117 of a region where an electrode 123 and an electrode 124 are formed is etched to form contact holes. In addition, the electrodes 123 and 124 are formed on the interlayer insulating film 121. The electrode 123 is electrically connected to the electrode 111 through one of the contact holes formed in the interlayer insulating film 121 and the protective film 117, and the electrode 124 is electrically connected to the auxiliary electrode 116 through the other contact hole formed in the interlayer insulating film 121 and the protective film 117 (see FIG. 8B). As the electrode 123 and the electrode 124, tungsten (W), titanium (Ti), tantalum (Ta), silver (Ag), or the like can be used.

In this embodiment mode, conductive films of titanium (Ti) which are formed to a thickness of 30 nm to 50 nm are used as the electrode 123 and the electrode 124.

Figure 9:
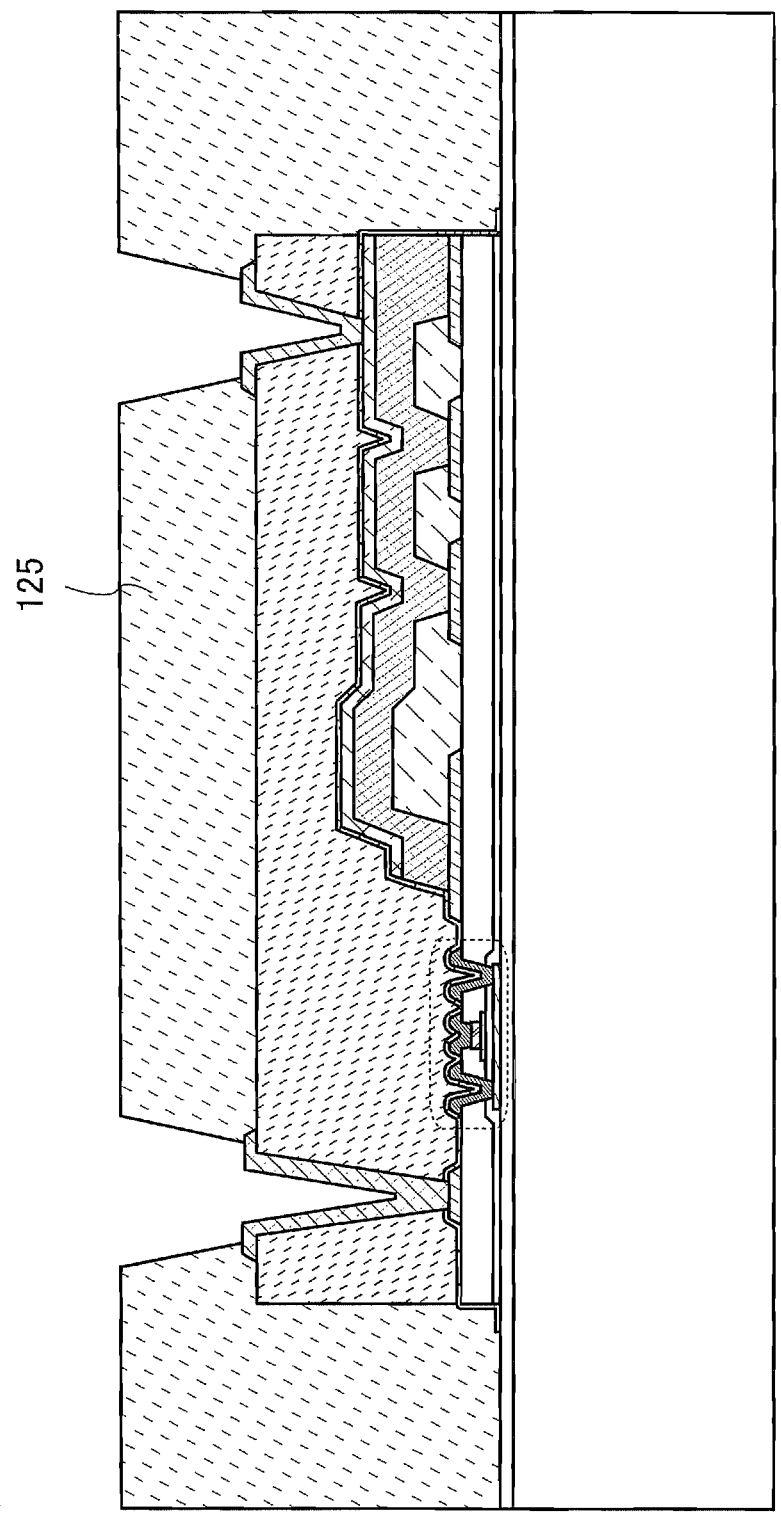
FIG. 9 is a cross-sectional view illustrating a manufacturing step of a photoelectric conversion device of the present invention.

Note that in the case where the auxiliary electrode 116 is not formed, the electrode 124 may be electrically connected to the topmost layer of the photoelectric conversion layer 115, i.e. the n-type semiconductor layer 115n in this embodiment mode Then, the interlayer insulating film 125 is formed over the interlayer insulating film 121 by screen printing or ink-jet printing (see FIG. 9). In that case, the interlayer insulating film 125 is not formed over the electrode 123 and electrode 124. In this embodiment mode, an epoxy resin is used for the interlayer insulating film 125.

Figure 10:
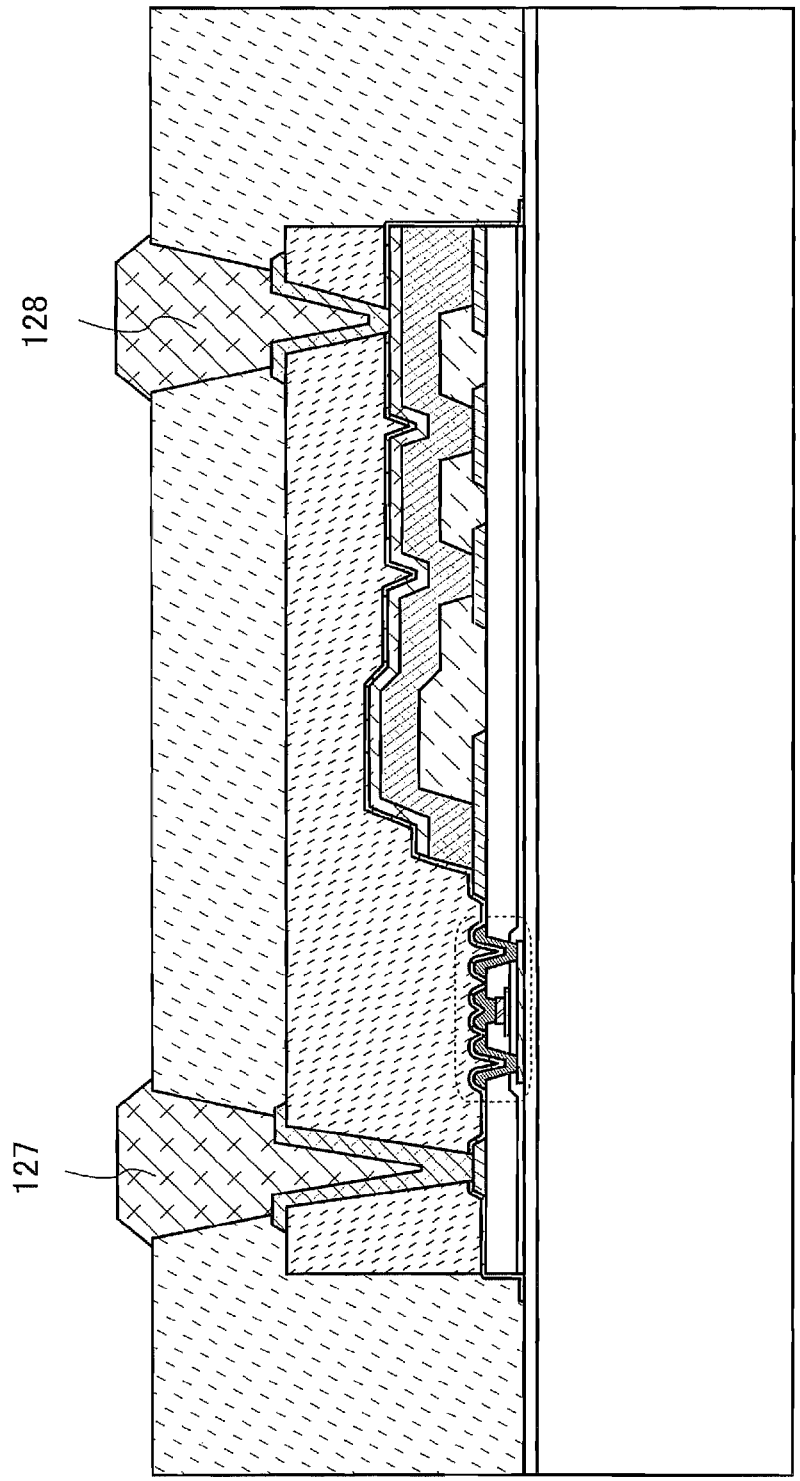
FIG. 10 is a cross-sectional view illustrating a manufacturing step of a photoelectric conversion device of the present invention.

Next, an electrode 127 electrically connected to the electrode 123 and an electrode 128 electrically connected to the electrode 124 are formed over the interlayer insulating film 125 by a printing method using nickel (Ni) paste, for example (see FIG. 10).

Figure 11:
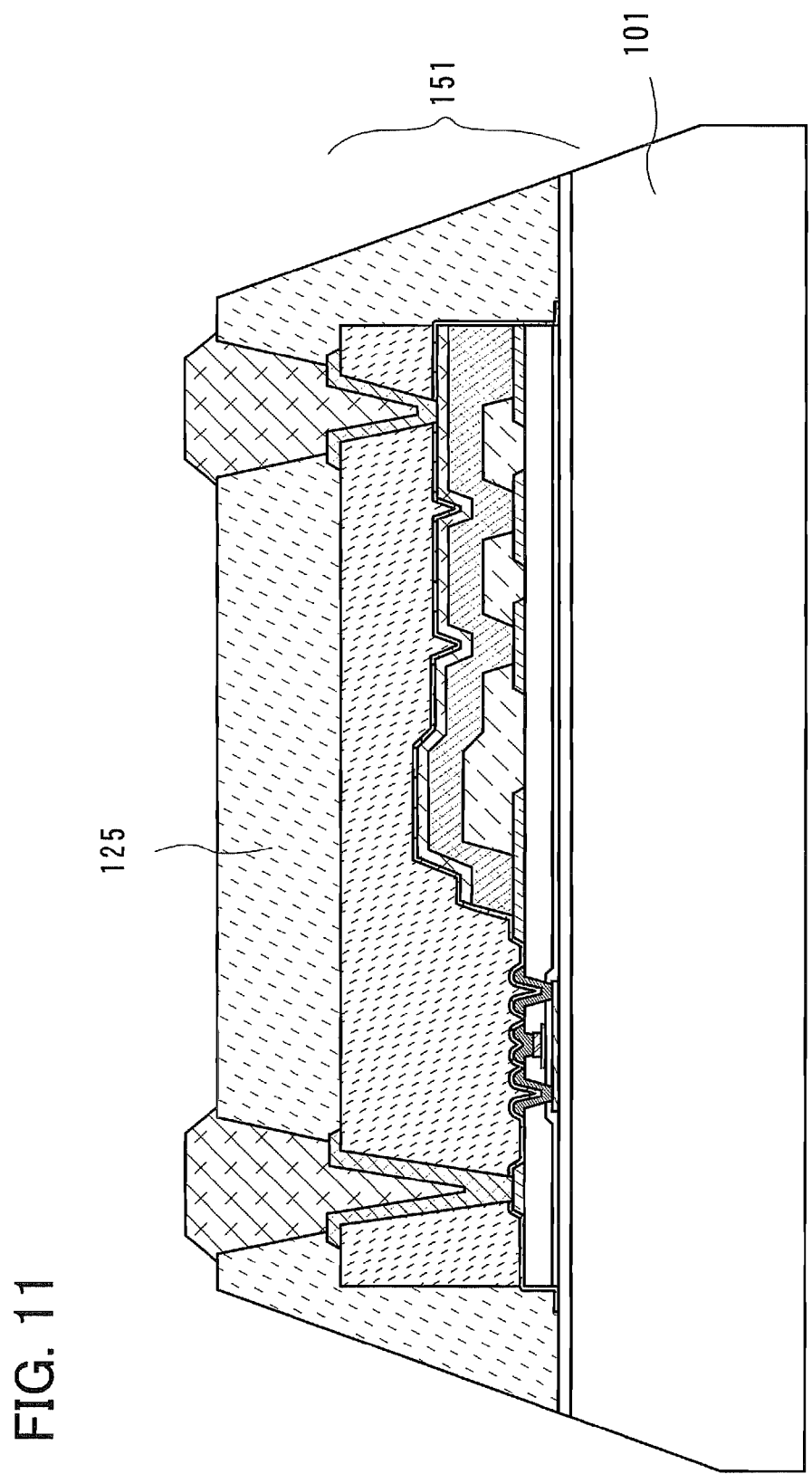
FIG. 11 is a cross-sectional view illustrating a manufacturing step of a photoelectric conversion device of the present invention.

Then, as shown in FIG. 11, edge portions of the substrate 101 and the interlayer insulating film 125 are removed by a dicing process to taper the edge portions. Specifically, the edge portions of the substrate 101 and the interlayer insulating film 125 are cut away to slope cross sections.

Actually, one optical sensor element including the photoelectric conversion layer 115, the TFT 103, and the like, which is shown in FIG. 1, FIGS. 4A and 4B, FIGS. 5A and 5B, FIGS. 6A and 6B, FIGS. 7A and 7B, FIGS. 8A and 8B, FIG. 9, FIG. 10, and FIG. 11 is obtained by dividing a large substrate over which element materials have been formed into individual optical sensor elements. The state is shown in FIGS. 2A and 2B.

Figure 2A:
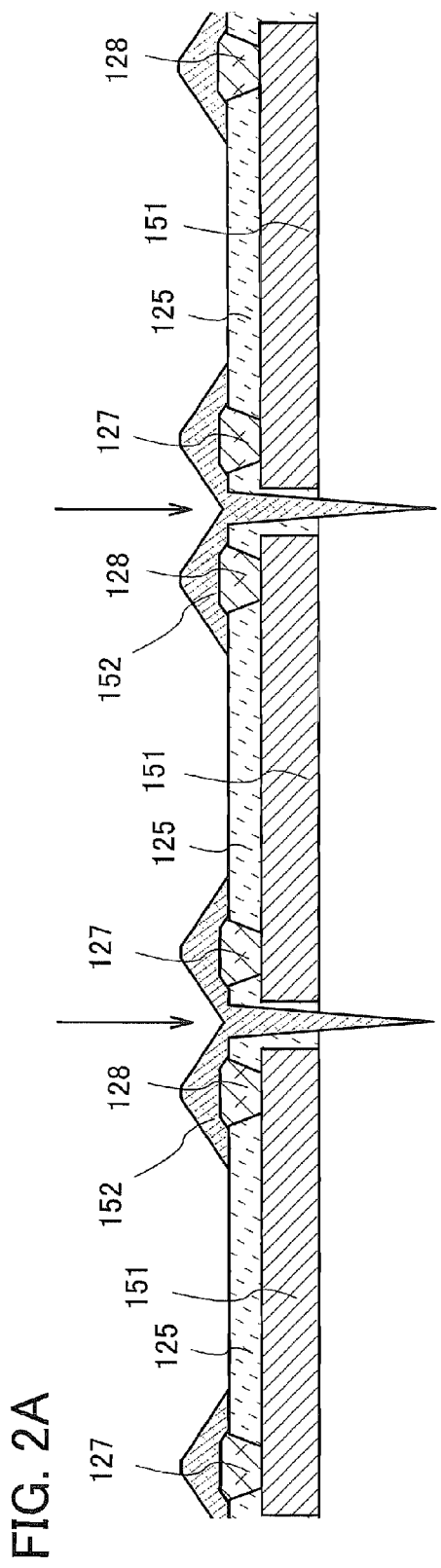
FIGS. 2A and 2B are cross-sectional views illustrating manufacturing steps of a photoelectric conversion device of the present invention.

In FIG. 2A, element layers 151, interlayer insulating films 125, electrodes 127, and electrodes 128 are formed over a large substrate 161. Each element layer 151 includes the whole structure formed between the substrate 101 and the interlayer insulating film 125 as shown in FIG. 11.

Parts of the side surfaces of the interlayer insulating film 125 and the substrate 161 which are between adjacent element layers 151 are cut away by a dicing process; thus, a gap having a wedge shape (or V-shape) is formed. Further, electrodes 152 are formed so as to cover the electrodes 127 and the electrodes 128 over the interlayer insulating films 125. The electrodes 152 fill the wedge-shaped gaps formed in the interlayer insulating films 125 and the substrate 161. The electrodes 152 are formed by a printing method using copper (Cu) paste.

Further, the interlayer insulating film 125 and the substrate 161 may be divided by laser irradiation instead of dicing.

A laser includes a laser medium, an excitation source, and a resonator. When lasers are classified by laser medium, there are a gas laser, a liquid laser, and a solid laser; when lasers are classified by oscillation characteristic, there are a free electron laser, a semiconductor laser, and an x-ray laser. Any of the lasers may be used in this embodiment mode. Note that a gas laser or a solid laser is preferably used, and more preferably, a solid laser is used.

As a gas laser, there are a helium-neon laser, a carbon dioxide gas laser, an excimer laser, an argon ion laser, and the like. An excimer laser includes a rare gas excimer laser and a rare gas halide excimer laser. A rare gas excimer laser oscillates by excited molecules of argon, krypton, or xenon. A gas laser includes a metal vapor ion laser.

A liquid laser includes an inorganic liquid laser, an organic chelate laser, and a dye laser. In an inorganic liquid laser and an organic chelate laser, rare earth ions such as neodymium, which are utilized for a solid laser, are used as a laser medium.

A laser medium used in a solid laser is a solid base doped with active species functioning as a laser. The solid base is a crystal or glass. The crystal is YAG (yttrium aluminum garnet crystal), YLF, YVO$_4$, YAlO$_3$, sapphire, ruby, or alexandrite. In addition, the active species functioning as a laser are, for example, trivalent ions (such as Cr$^{3+}$, Nd$^{3+}$, Yb$^{3+}$, Tm$^{3+}$, Ho$^{3+}$, Er$^{3+}$, or Ti$^{3+}$).

Note that as a laser which is used in this embodiment mode, a continuous wave laser or a pulsed wave laser can be used. An irradiation condition of a laser beam (e.g., repetition rate, power density, energy density, and a beam profile) is appropriately adjusted in consideration of the thickness, the material, or the like of the substrate 161 and the interlayer insulating film 125.

As a laser used when the substrate 161 is a glass substrate, a solid laser having a wavelength of 1 nm or more to 380 nm or less, which is an ultraviolet region, is preferably used. More preferably, an Nd:YVO$_4$ laser having a wavelength of 1 nm or more to 380 nm or less, which is an ultraviolet region, is used. It is because light is more easily absorbed in a substrate (especially a glass substrate) by using a laser having a wavelength of an ultraviolet region compared with other laser at a longer wavelength side, and an ablation process is easily performed. Moreover, it is because an ablation process is easily performed especially by using an Nd:YVO$_4$ laser.

In addition, when a laser beam is emitted to a glass substrate to form a groove in the glass substrate, a cutting surface of the groove is rounded. When the cutting surface is rounded, a defect of a corner of the cutting surface or a crack can be prevented from being generated as compared with a case where there is a corner at a cutting surface. According to such an advantage, a glass substrate can be easily handled mainly when the glass substrate is carried using a robot or the like. Moreover, also in being mounted on a product, generation of a defect or a crack can be suppressed, and damage on or destruction of a substrate can be suppressed.

Note that an ablation process utilizes a phenomenon in which a molecular bond in a portion irradiated with a laser beam, that is, the portion absorbing the laser beam is cut off, photodegraded, and evaporated is used. In other words, the method for manufacturing grooves of this embodiment mode is as follows. A substrate is irradiated with a laser beam, and then molecular bonds in a portion irradiated with the laser beam are cut off, photodegraded, and evaporated; accordingly, the groove is formed.

Note that a laser irradiation device for emitting the above laser beam has a moving table, a substrate, a head portion, and a control portion. The moving table is provided with an adsorption hole. The substrate is held by the adsorption hole over the moving table. The head portion emits a laser beam which is emitted from a laser oscillation device through a laser head. The control portion positions the laser head at an aimed place over the surface of the substrate by moving one or both of the moving table and the head portion, and then a laser beam is emitted. Note that the control portion recognizes and determines a portion to be processed from a relative position on the basis of a mark for positioning over a substrate which is taken by a CCD camera.

Figure 2B:
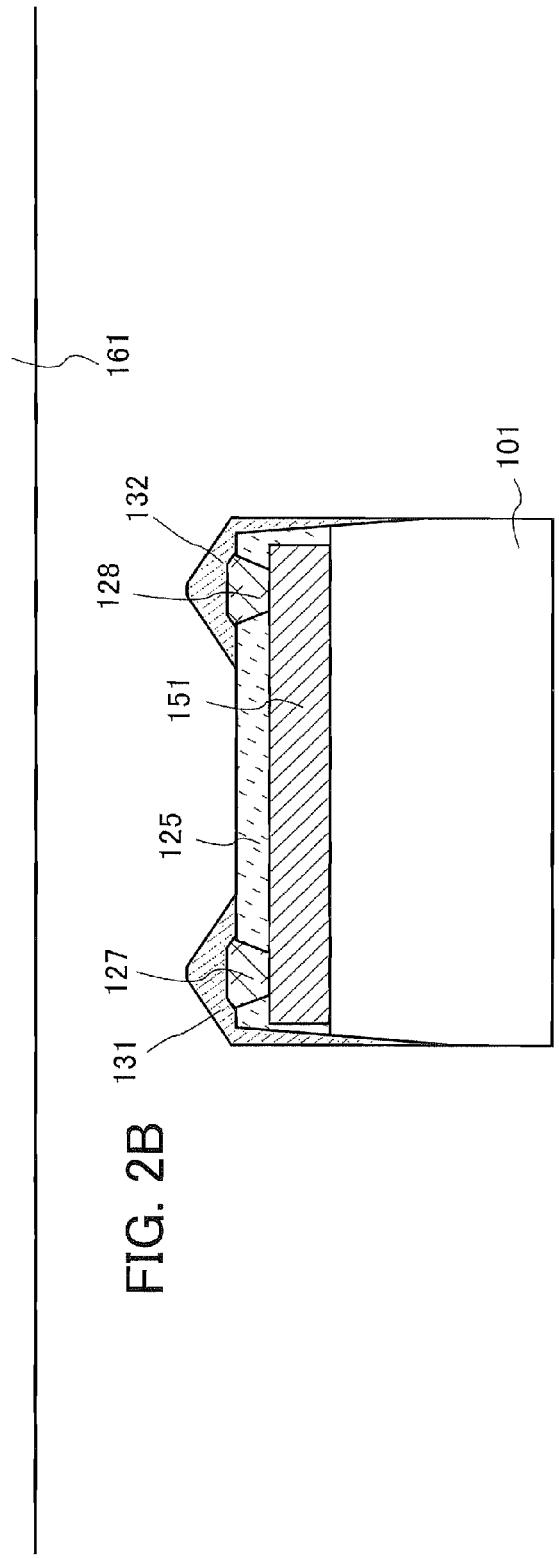
Figure 3A:
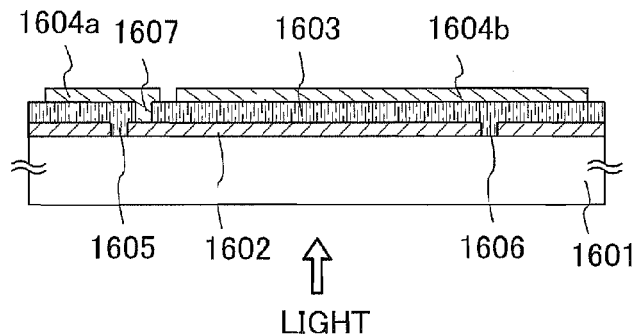
FIGS. 3A to 3D are cross-sectional views of conventional photoelectric conversion devices.
Figure 3B:
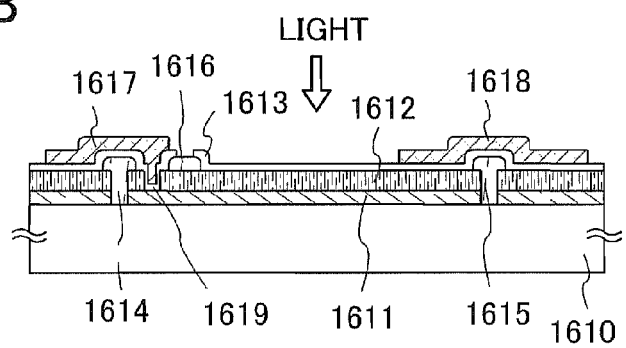
Figure 3C:
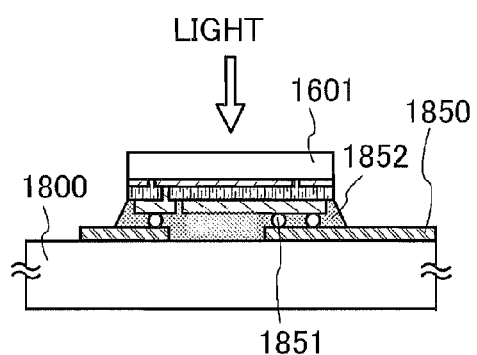
Figure 3D:
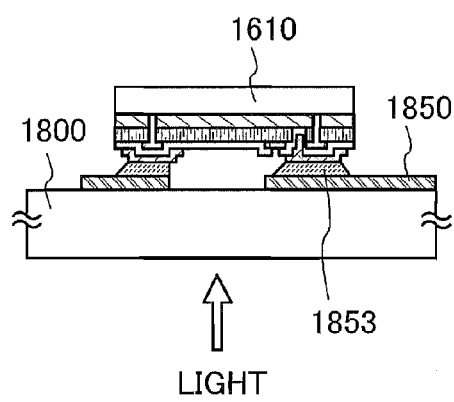

Next, dicing is performed along the center line of the electrode 152 to divide the electrode 152 and the substrate 161, thereby forming one photoelectric conversion element (see FIG. 1 and FIG. 2B).

This process step may be performed by laser irradiation instead of dicing. Specifically, a laser beam may be applied along the center line of the electrode 152 to divide the electrode 152 and the substrate 161, thereby forming one photoelectric conversion element.

The electrode 152 is divided and an electrode 131 connected to the electrode 127, an electrode 132 connected to the electrode 128 are formed. The electrode 131 and the electrode 132 are also formed on side surfaces of the interlayer insulating film 125 and portions of side surfaces of the substrate 101 which are exposed through the dicing process.

Figure 20:
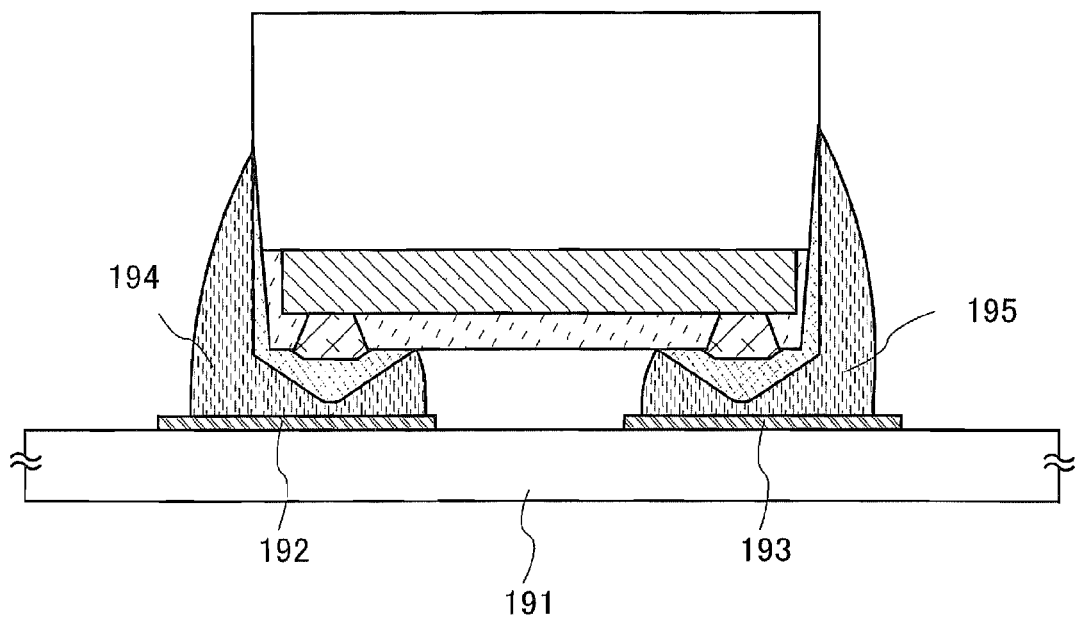
FIG. 20 is a cross-sectional view of a photoelectric conversion device of the present invention.

The obtained photoelectric conversion element is attached to a printed substrate 191 provided with an electrode 192 and an electrode 193 (see FIG. 20). The top surfaces of electrode 131 and the electrode 132 are opposed to the electrode 192 and the electrode 193, respectively, and they are attached to each other with conductive materials 194 and 195. Here, the adhesion occurs not only at the surfaces of the electrode 192 and the electrode 193, and top surfaces of the electrode 131 and the electrode 132, but also at side surfaces of the electrode 131 and the electrode 132; thus, adhesiveness can be increased. Therefore, separation between the printed substrate 191 and the photoelectric conversion element can be prevented.

Further, when the photoelectric conversion element is attached to the printed substrate 191, the conductive materials 194 and 195 are melted but extended to portions of the side surfaces of the photoelectric conversion element. Therefore, the photoelectric conversion element can be attached to the printed substrate 191 in a balanced manner, which makes it possible to mount the photoelectric conversion element on the printed substrate 191 horizontally.

Note that as the conductive materials 194 and 195, solder or the like can be used.

When solder is used for the conductive materials 194 and 195, a reflow method is used. A reflow method is a method in which a paste solder is applied on a printed substrate by printing, a component is mounted thereon, and heat is applied thereto to melt the solder. The heating may be performed by infrared heating or hot air heating, for example.

In a photoelectric conversion device including a photoelectric conversion element manufactured in accordance with this embodiment, the photoelectric conversion element inside is more securely attached to the printed substrate, which makes it harder for the photoelectric conversion device to be separate as compared with conventional photoelectric conversion devices; thus, a highly reliable photoelectric conversion device can be obtained.

Further, in a photoelectric conversion device including a photoelectric conversion element which is obtained in accordance with this embodiment mode, the photoelectric conversion element can be attached to the printed substrate horizontally; thus, a more reliable photoelectric conversion device can be obtained.

Embodiment Mode 2

In this embodiment mode, a method for manufacturing a photoelectric conversion device having a structure different from the one in Embodiment Mode 1 with reference to FIGS. 26A and 26B, FIGS. 27A and 27B, FIG. 28, and FIGS. 29A and 29B. Note parts like the ones in Embodiment Mode 1 are denoted by the same reference numerals.

Figure 26A:
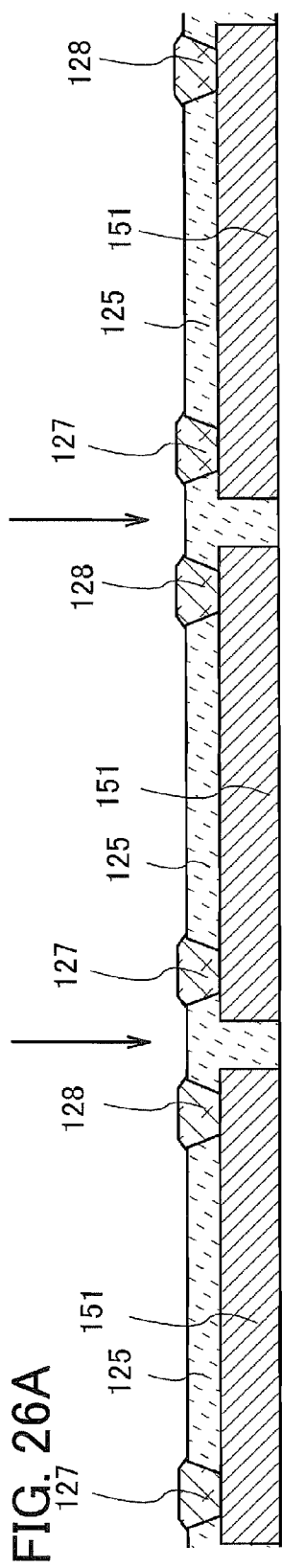
FIGS. 26A and 26B are cross-sectional views illustrating manufacturing steps of a photoelectric conversion device of the present invention.

First, process steps up to and including the step shown in FIG. 10 are performed based on the description of Embodiment Mode 1. FIG. 26A shows a state where a plurality of the structures shown in FIG. 10 are formed over the substrate 161.

Figure 26B:
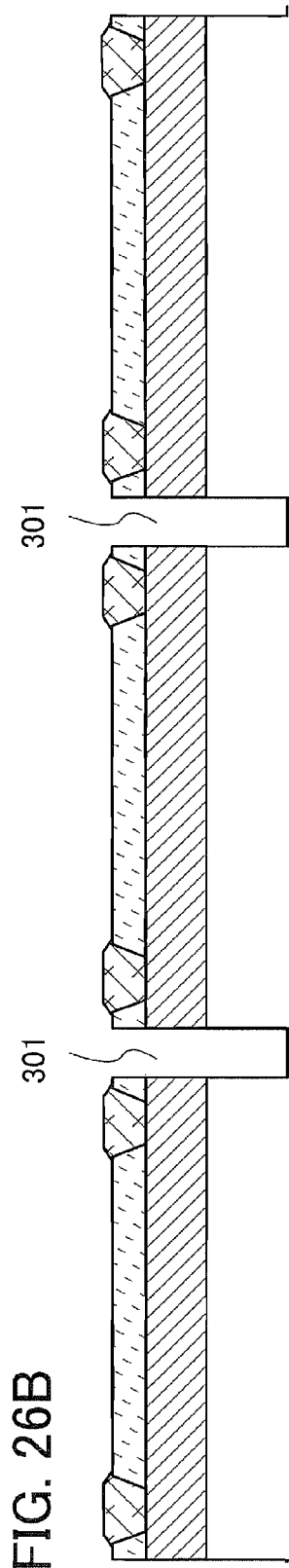

Then, portions between the element layers 151 are cut partway through a substrate 161 and the portions are removed through a dicing process, (also referred to as "halfcut" in this specification), thereby forming grooves 301 (see FIG. 26B).

In this embodiment mode, the depth of the grooves 301 is half the thickness of the substrate 161. Specifically, the grooves 301 are formed using a blade having a width of 0.2 mm. A glass substrate having a thickness of 0.5 mm is used as the substrate 161, and the grooves 301 have a depth of 0.25 mm.

Next, electrodes 302 are formed so as to cover the electrodes 127 and the electrodes 128 and fill the grooves 301 (see FIG. 27A). The electrode 302 is formed by a printing method using copper (Cu) paste.

Figure 28:
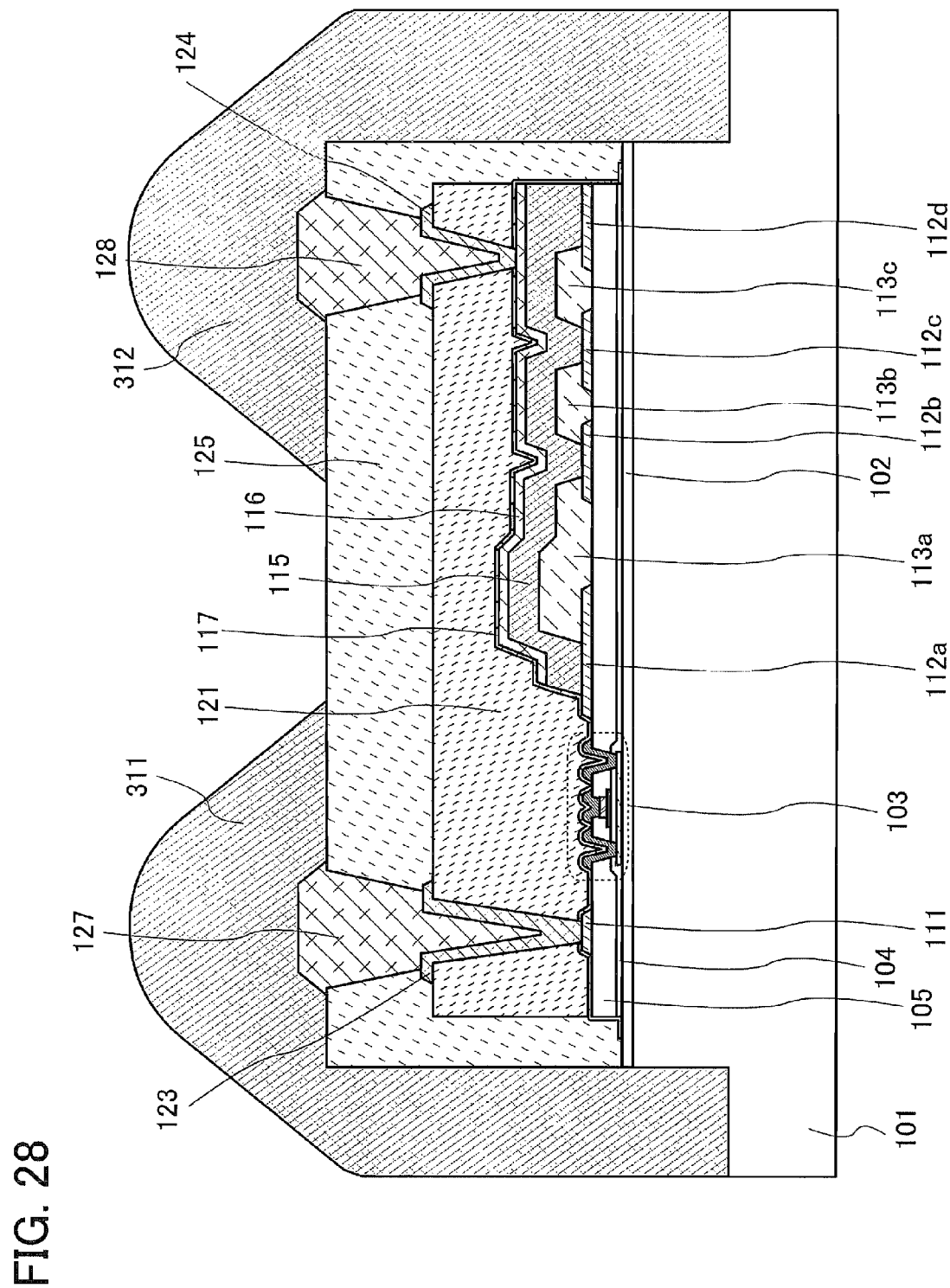
FIG. 28 is a cross-sectional view illustrating a manufacturing step of a photoelectric conversion device of the present invention.
Figure 29A:
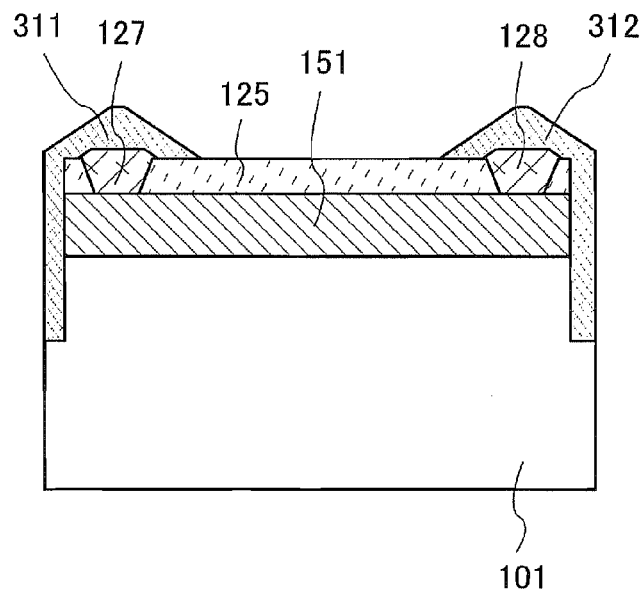
FIGS. 29A and 29B are cross-sectional views illustrating manufacturing steps of a photoelectric conversion device of the present invention.

Then, dicing is performed along the center line of the electrode 302 (see FIG. 27B) to divide the electrode 302 and the substrate 161, thereby forming one photoelectric conversion element (see FIG. 29A and FIG. 28).

In this embodiment mode, the electrode 302 and the substrate 161 are divided using a blade having a width of 0.1 mm.

By dividing the electrode 302, an electrode 311 connected to the electrode 127 and an electrode 312 connected to the electrode 128 are formed. The electrode 311 and the electrode 312 are also formed on surfaces of the interlayer insulating film 125 and the substrate 101 which are exposed through the dicing process.

Figure 29B:
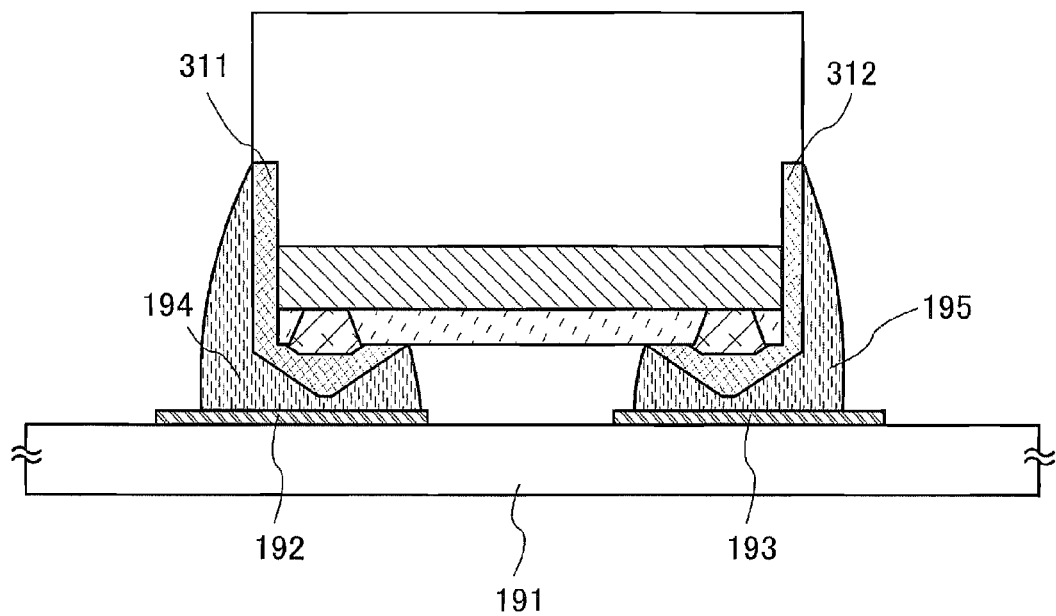

The obtained photoelectric conversion element is attached to a printed substrate 191 provided with the electrode 192 and the electrode 193 (see FIG. 29B). The electrode 311 and the electrode 312 are opposed to the electrode 192 and the electrode 193, respectively, and they are attached to each other with the conductive materials 194 and 195. Here, the adhesion occurs not only at the surface of the electrode 192 and the electrode 193 and top surfaces of the electrode 331 and the electrode 312, but also at the side surfaces of the electrode 331 and the electrode 312; thus, adhesiveness can be increased.

Therefore, separation between the printed substrate 191 and the photoelectric conversion element can be prevented.

In a photoelectric conversion device including a photoelectric conversion element manufactured in accordance with this embodiment, the photoelectric conversion element inside is more securely attached to the printed substrate, which makes it harder for the photoelectric conversion device to be separate as compared with conventional photoelectric conversion devices; thus, a highly reliable photoelectric conversion device can be obtained.

Further, in a photoelectric conversion device including a photoelectric conversion element which is obtained in accordance with this embodiment mode, the photoelectric conversion element can be attached to the printed substrate horizontally; thus, a more reliable photoelectric conversion device can be obtained.

Embodiment Mode 3

Examples of various electronic devices which include photoelectric conversion devices in accordance with Embodiment Mode 1 and Embodiment Mode 2 will be described in this embodiment mode. Examples of electronic devices described in this embodiment mode include computers, displays, mobile phones, television units, and the like. Specific examples of such electronic devices are shown in FIG. 21, FIGS. 22A and 22B, FIGS. 23A and 23B, FIG. 24, and FIGS. 25A and 25B.

Figure 21:
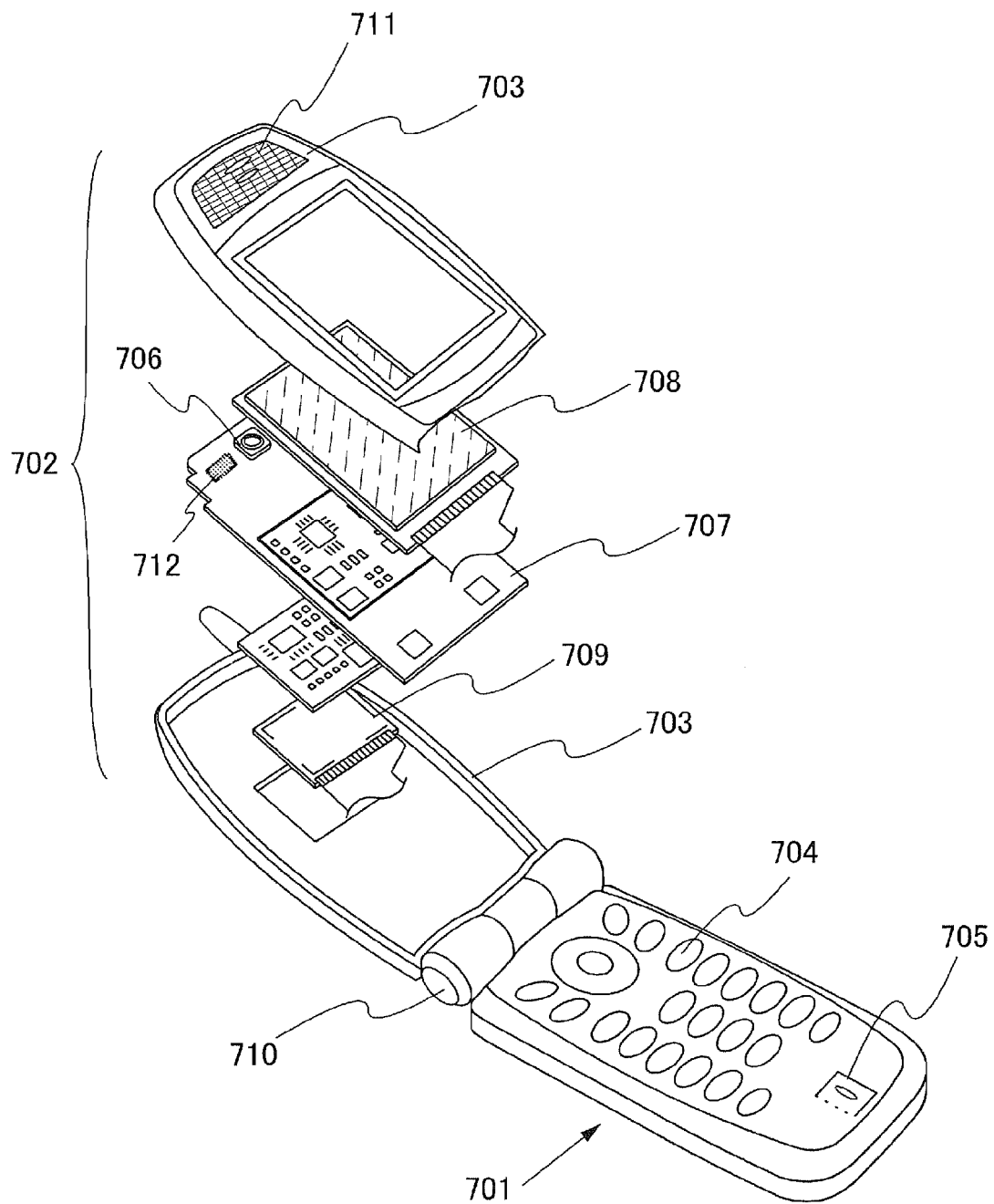
FIG. 21 is a diagram illustrating a device mounted with a semiconductor device of the present invention.

FIG. 21 illustrates a mobile phone, which includes a main body (A) 701, a main body (B) 702, a housing 703, operation keys 704, an audio input portion 705, an audio output portion 706, a circuit board 707, a display panel (A) 708, a display panel (B) 709, a hinge 710, a light-transmitting material portion 711, and a photoelectric conversion device 712 which can be obtained in accordance with Embodiment Mode 1 to Embodiment Mode 2.

The photoelectric conversion device 712 detects light that has passed through the light-transmitting material portion 711, and controls the luminance of the display panel (A) 708 and the display panel (B) 709 as well as controlling the lighting of the operation keys 704 in accordance with the illuminance of outside light that has been detected by the photoelectric conversion device 712. Accordingly, power consumption of the mobile phone can be suppressed.

Figure 22A:
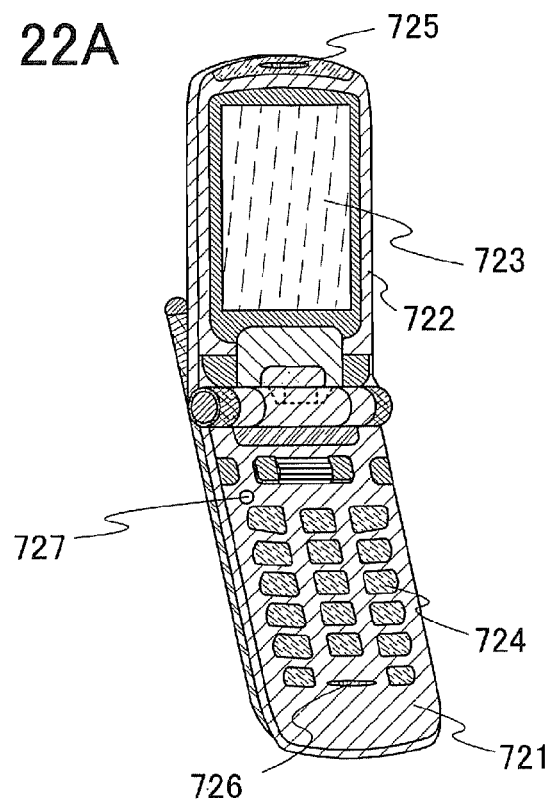
FIGS. 22A and 22B are diagrams illustrating devices each mounted with a semiconductor device of the present invention.
Figure 22B:
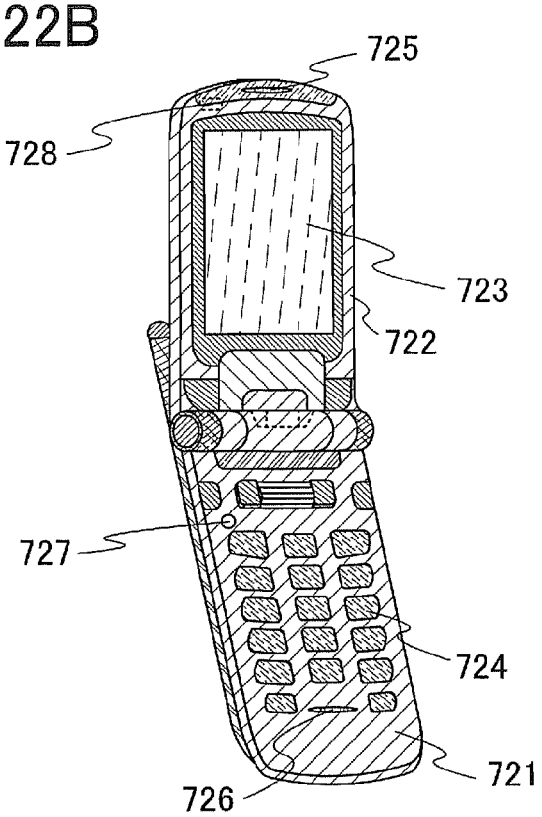

FIGS. 22A and 22B illustrate other examples of mobile phones. Mobile phone in FIGS. 22A and 22B each includes a main body 721, a housing 722, a display panel 723, operation keys 724, an audio output portion 725, an audio input portion 726, and photoelectric conversion devices 727 and 728 which can be obtained in accordance with Embodiment Mode 1 to Embodiment Mode 52.

In the mobile phone shown in FIG. 22A, luminance of the display panel 723 and the operation keys 724 can be controlled by detecting outside light with the photoelectric conversion element 727 provided in the main body 721.

In the mobile phone shown in FIG. 22B, the photoelectric conversion device 728 is provided inside the main body 721 in addition to the structure of FIG. 22A. With the photoelectric conversion device 728, luminance of a backlight provided in the display panel 723 can also be detected.

Figure 23A:
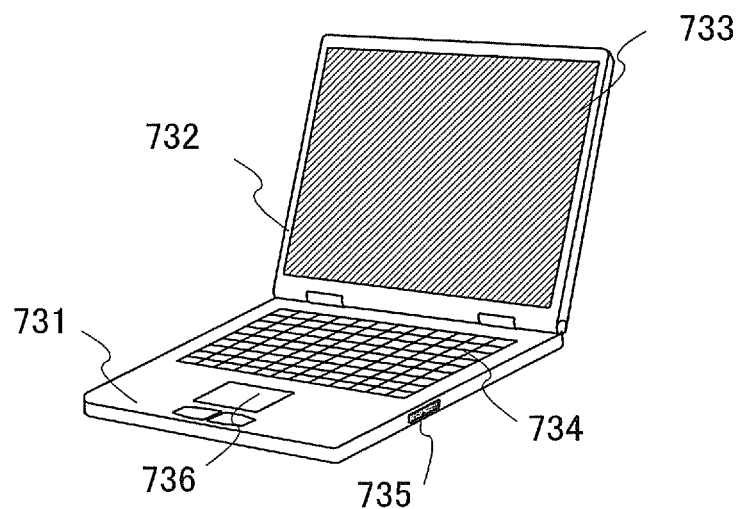
FIGS. 23A and 23B are diagrams illustrating devices each mounted with a semiconductor device of the present invention.

FIG. 23A illustrates a computer which includes a main body 731, a housing 732, a display portion 733, a keyboard 734, an external connection port 735, a pointing device 736, and the like.

Figure 23B:
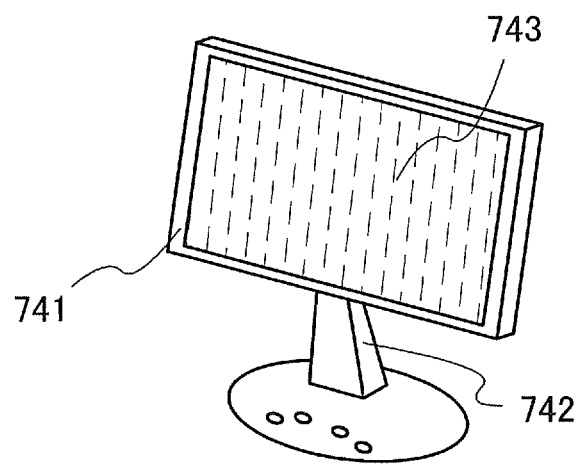

FIG. 23B illustrates a display device which corresponds to a television receiver for example. The display device includes a housing 741, a supporting base 742, a display portion 743, and the like.

Figure 24:
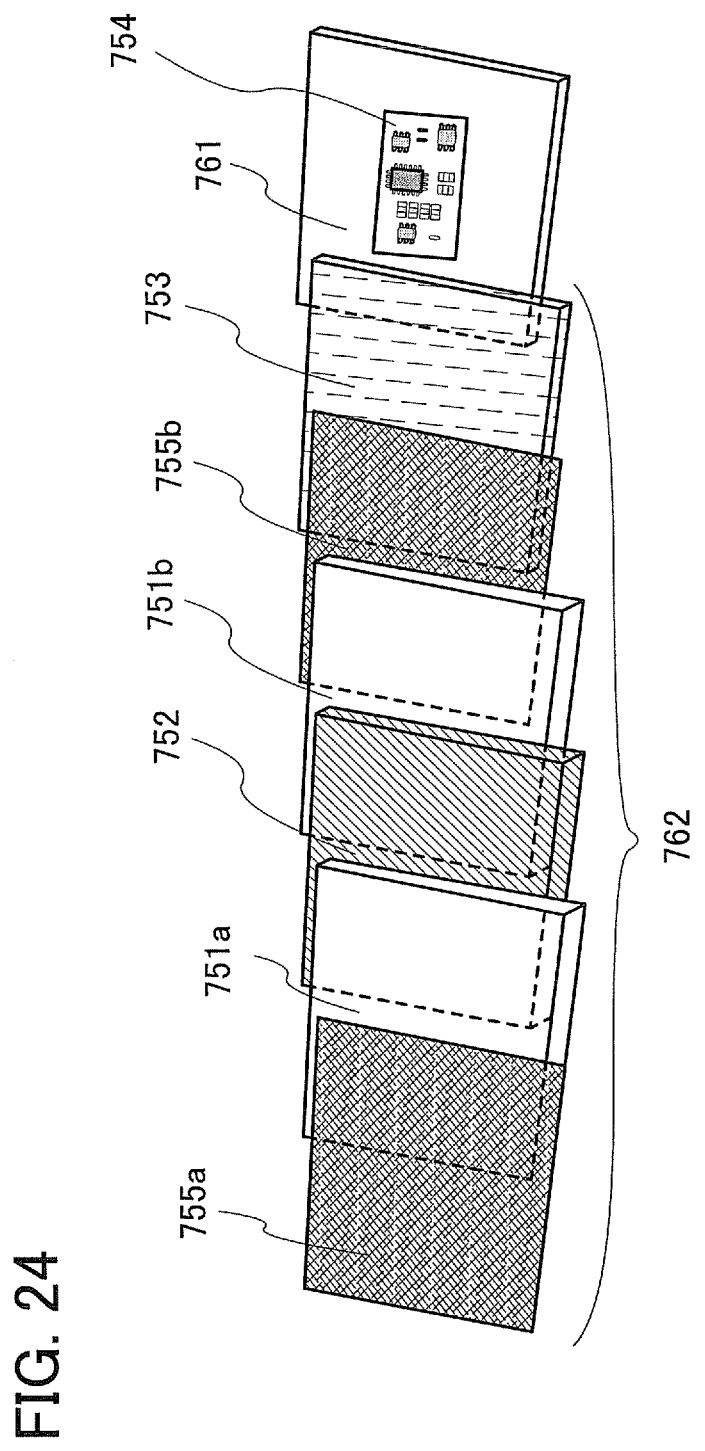
FIG. 24 is a diagram illustrating a device mounted with a semiconductor device of the present invention.

FIG. 24 illustrates a specific configuration where a liquid crystal panel is used as the display portion 733 provided in the computer shown in FIG. 23A and the display portion 743 of the display device shown in FIG. 23B.

A liquid crystal panel 762 shown in FIG. 24 is built into a housing 761, and includes substrates 751a and 751b, a liquid crystal layer 752 sandwiched therebetween, polarization filters 755a and 755b, a backlight 753, and the like. In the housing 761, a photoelectric conversion device formation region 754 having a photoelectric conversion device which can be obtained in accordance with Embodiment Mode 1 to Embodiment Mode 2 is formed.

The photoelectric conversion device formation region 754 detects the amount of light from the backlight 753, the data of which is fed back to control the luminance of the liquid crystal panel 762.

Figure 25A:
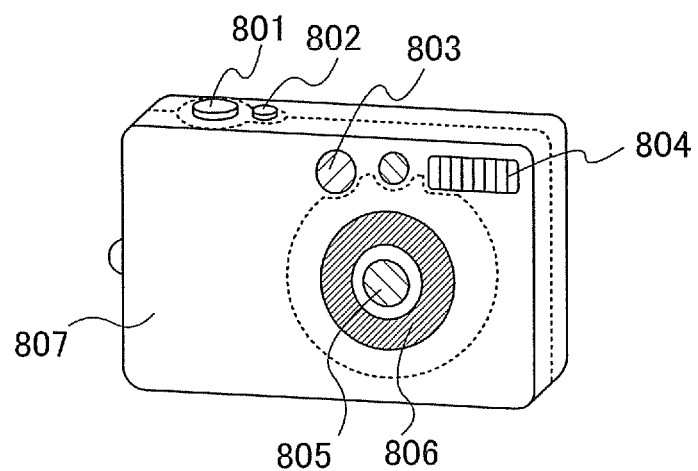
FIGS. 25A and 25B are diagrams illustrating a device mounted with a semiconductor device of the present invention.
Figure 25B:
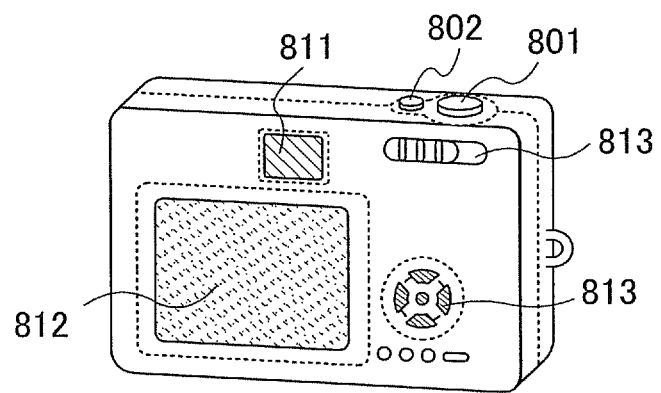

FIGS. 25A and 25B illustrate an example where a photoelectric conversion device is built into a camera, e.g., a digital camera. FIG. 25A is a perspective view of the digital camera seen from the front side, and FIG. 25B is a perspective view thereof seen from the rear side.

In FIG. 25A, the digital camera is provided with a release button 801, a main switch 802, a viewfinder 803, a flash portion 804, a lens 805, a barrel 806, and a housing 807.

In FIG. 25B, the digital camera is also provided with a viewfinder eyepiece 811, a monitor 812, and operation buttons 813.

When the release button 801 is pushed down to the half point, a focus adjustment mechanism and an exposure adjustment mechanism are activated. When the release button is pushed down to the lowest point, a shutter opens.

By pushing down or rotating the main switch 802, power of the digital camera is switched on or off.

The viewfinder 803 is located above the lens 805 on the front side of the digital camera, for checking the shooting range and the focus point from the viewfinder eyepiece 811 shown in FIG. 25B.

The flash portion 804 is located in the upper portion of the front side of the digital camera. When the luminance of the photographic subject is not enough, the release button may be pushed down to open the shutter and deliver auxiliary light from the flash portion 804.

The lens 805 is located at the front side of the digital camera and includes a focusing lens, a zoom lens, and the like. This lens, in conjunction with a shutter and a diaphragm (not shown), constitutes an imaging optical system. Behind the lens, an imaging device such as a CCD (Charge Coupled Device) is provided.

The barrel 806 moves the position of the lens to adjust the focus of the focusing lens, the zoom lens, and the like. In shooting, the barrel is slid out to move the lens 805 forward. When carrying the digital camera, the lens 805 is moved backward to be compact. Note that a structure is employed in this embodiment mode in which the photographic subject can be zoomed and shot by sliding out the barrel; however, the invention is not limited to this structure. For example, a digital camera may be constructed which can zoom and shoot the photographic subject without sliding out the barrel with the use of the imaging optical system inside the housing 807.

The viewfinder eyepiece 811 is located in the upper portion of the rear side of the digital camera for looking therethrough in checking the shooting range and the focus point.

The operation buttons 813 are buttons with various functions provided on the rear side of the digital camera, which include a setup button, a menu button, a display button, a function button, a selection button, and the like.

When a photoelectric conversion device is built into the camera shown in FIGS. 25A and 25B, presence and intensity of outside light can be detected with the photoelectric conversion device; thus, exposure adjustment and the like of the camera can be performed.

In addition, a photoelectric conversion device can also be applied to other electronic devices such as a projection TV and a navigation system. That is, the photosensor of the invention can be applied to any object which needs to detect light.

This application is based on Japanese Patent Application serial no. 2007-034650 filed with Japan Patent Office on Feb. 15, 2007, the entire contents of which are hereby incorporated by reference.

What is claimed is:

1. A semiconductor device comprising:
    a substrate comprising an insulating surface;
    a semiconductor layer over the substrate;
    a first insulating layer over the substrate, the first insulating layer covering a portion of a side surface of the semiconductor layer;
    a second insulating layer covering a portion of a top surface and whole of side surfaces of the first insulating layer;
    a first electrode over the second insulating layer; and
    a second electrode over the second insulating layer,
    wherein each of the first and second electrodes continuously extends from a top surface of the second insulating layer to a portion of a side surface of the substrate.

2. The semiconductor device according to claim 1, wherein the semiconductor layer comprises a stacked-structure of a p-type semiconductor layer, an i-type semiconductor layer, and an n-type semiconductor layer.

3. The semiconductor device according to claim 1, wherein the first insulating layer is formed over the semiconductor layer.

4. The semiconductor device according to claim 1, further comprising:
    first and second output terminals formed over the second insulating layer, the first output terminal being electrically connected to the semiconductor layer;
    wherein each of the first and second output terminals is a taper shape, and
    wherein each of the first and second electrodes covers the whole of top surfaces of the first and second output terminals, respectively.

5. An electronic device comprising the semiconductor device according to claim 1.

6. The semiconductor device according to claim 1, wherein an edge portion of the second insulating layer is cut away to slope cross section.

7. The semiconductor device according to claim 1, wherein edge portions of the substrate and the second insulating layer are cut away to slope cross section continuously.

8. The semiconductor device according to claim 1, wherein a portion of the second insulating layer is in contact with a portion of the insulating surface.

9. A semiconductor device comprising:
    a substrate comprising an insulating surface;
    a photoelectric conversion layer over the substrate;
    a first insulating layer over the substrate, the first insulating layer covering a portion of a side surface of the photoelectric conversion layer;
    a second insulating layer covering a portion of a top surface and whole of side surfaces of the first insulating layer;

a first electrode over the second insulating layer; and
a second electrode over the second insulating layer,
wherein each of the first and second electrodes continuously extends from a top surface of the second insulating layer to a portion of a side surface of the substrate.

10. The semiconductor device according to claim 9, wherein the photoelectric conversion layer comprises a stacked-structure of a p-type semiconductor layer, an i-type semiconductor layer, and an n-type semiconductor layer.

11. The semiconductor device according to claim 9, wherein the first insulating layer is formed over the photoelectric conversion layer.

12. The semiconductor device according to claim 9, further comprising:
first and second output terminals formed over the second insulating layer, the first output terminal being electrically connected to the photoelectric conversion layer;
wherein each of the first and second output terminals is a taper shape, and
wherein each of the first and second electrodes covers the whole of top surfaces of the first and second output terminals, respectively.

13. An electronic device comprising the semiconductor device according to claim 9.

14. The semiconductor device according to claim 9, wherein an edge portion of the second insulating layer is cut away to slope cross section.

15. The semiconductor device according to claim 9, wherein edge portions of the substrate and the second insulating layer are cut away to slope cross section continuously.

16. The semiconductor device according to claim 9, wherein a portion of the second insulating layer is in contact with a portion of the insulating surface.

* * * * *